(12) United States Patent
Hui et al.

(10) Patent No.: US 11,832,057 B2
(45) Date of Patent: *Nov. 28, 2023

(54) PIEZOELECTRIC MEMS MICROPHONE

(71) Applicant: Skyworks Solutions, Inc., Irvine, CA (US)

(72) Inventors: Yu Hui, Merced, CA (US); Guofeng Chen, Fremont, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/064,896

(22) Filed: Dec. 12, 2022

(65) Prior Publication Data

US 2023/0114813 A1 Apr. 13, 2023

Related U.S. Application Data

(63) Continuation of application No. 17/138,438, filed on Dec. 30, 2020, now Pat. No. 11,533,567, which is a continuation of application No. 16/983,366, filed on Aug. 3, 2020, now Pat. No. 11,350,219.

(60) Provisional application No. 62/885,981, filed on Aug. 13, 2019, provisional application No. 62/885,974, filed on Aug. 13, 2019.

(51) Int. Cl.
*H04R 17/02* (2006.01)
*B81B 3/00* (2006.01)
*H10N 30/20* (2023.01)

(52) U.S. Cl.
CPC ........... *H04R 17/02* (2013.01); *B81B 3/0021* (2013.01); *H10N 30/2047* (2023.02); *B81B 2201/0257* (2013.01); *H04R 2201/003* (2013.01)

(58) Field of Classification Search
CPC .......... B81B 3/0021; B81B 2201/0257; H04R 17/02; H04R 2201/003; H04R 31/00; H04L 41/1136; H04L 41/1873; H04L 41/1132
See application file for complete search history.

(56) References Cited

U.S. PATENT DOCUMENTS 6,657,517 B2 * 12/2003 Barber ..................... H03H 3/04
29/25.35
6,857,501 B1 2/2005 Han
(Continued)

FOREIGN PATENT DOCUMENTS

CN 109495829 3/2019
CN 110545514 12/2019
(Continued)

*Primary Examiner* — Brian Ensey
(74) *Attorney, Agent, or Firm* — Knobbe, Martens, Olson & Bear LLP

(57) ABSTRACT

A piezoelectric microelectromechanical systems microphone can be mounted on a printed circuit board. The microphone can include a substrate with an opening between a bottom end of the substrate and a top end of the substrate. The microphone can include a single piezoelectric film layer disposed over the top end of the substrate and defining a diaphragm structure, the single piezoelectric film layer having substantially zero residual stress and formed from a piezoelectric wafer. The microphone can include one or more electrodes disposed over the diaphragm structure. The diaphragm structure is configured to deflect when subjected to sound pressure via the opening in the substrate.

21 Claims, 11 Drawing Sheets

(56) References Cited

U.S. PATENT DOCUMENTS

| | | |
|---|---|---|
| 8,466,606 B2 | 6/2013 | Chen |
| 8,531,088 B2 | 9/2013 | Grosh |
| 8,582,788 B2 | 11/2013 | Leidl et al. |
| 9,029,963 B2 | 5/2015 | Sparks et al. |
| 9,055,372 B2 | 6/2015 | Grosh |
| 9,386,379 B2 | 7/2016 | Sparks |
| 9,479,875 B2 | 10/2016 | Hall |
| 9,516,421 B1 | 12/2016 | Loeppert |
| 9,853,201 B2 | 12/2017 | Grosh et al. |
| 10,001,391 B1 | 6/2018 | Littrell |
| 10,170,685 B2 | 1/2019 | Grosh et al. |
| 10,356,531 B2 | 7/2019 | Giusti et al. |
| 10,825,982 B1 | 11/2020 | Littrell et al. |
| 11,099,078 B1 * | 8/2021 | Littrell ............ G01K 1/14 |
| 11,350,219 B2 | 5/2022 | Hui et al. |
| 2009/0116662 A1 | 5/2009 | Wu |
| 2015/0255308 A1 * | 9/2015 | Lin ............ H01L 21/3245 |
| | | 438/479 |
| 2018/0138391 A1 * | 5/2018 | Grosh ............ H04R 17/00 |
| 2020/0148532 A1 | 5/2020 | Grosh et al. |
| 2021/0120346 A1 | 4/2021 | Hui et al. |

FOREIGN PATENT DOCUMENTS

| | | |
|---|---|---|
| JP | 2018 137297 | 8/2018 |
| KR | 10-1545271 | 8/2015 |
| TW | I727164 B | 5/2021 |
| WO | WO 2017/200219 | 11/2017 |

\* cited by examiner

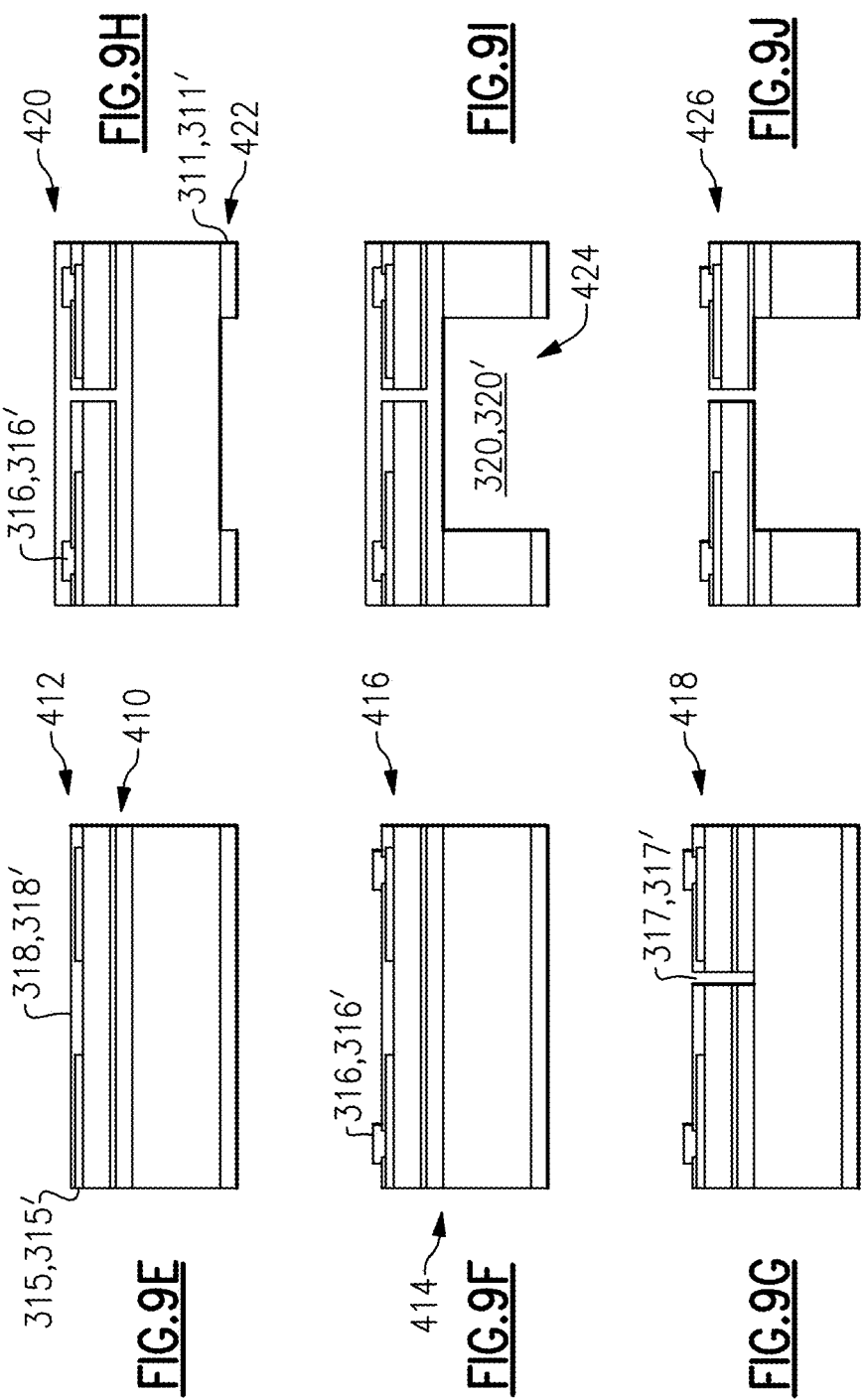

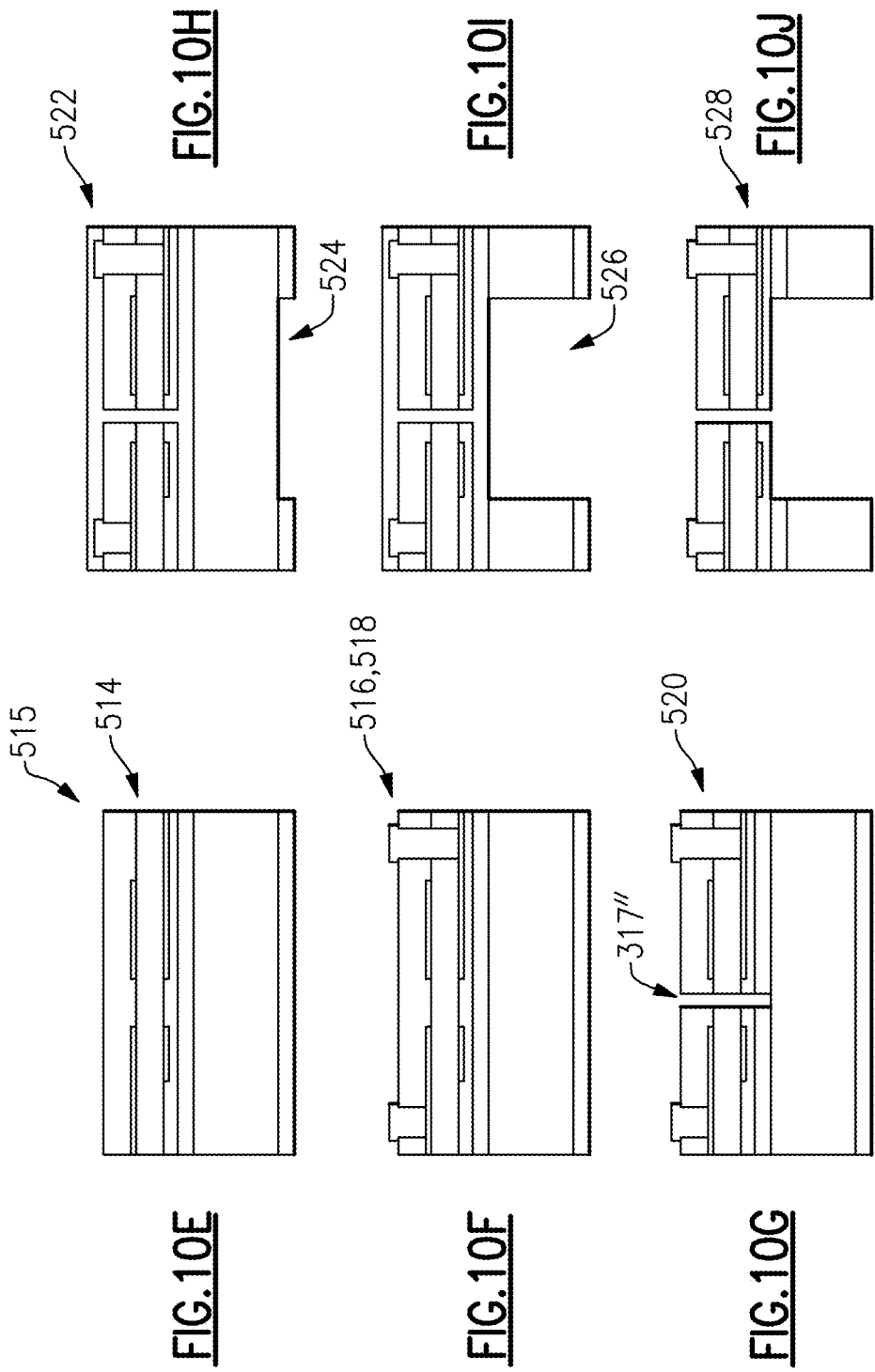

PIEZOELECTRIC MEMS MICROPHONE

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND OF THE INVENTION

Field

The present disclosure is directed to a piezoelectric microelectromechanical systems (MEMS) microphone, and in particular to a single piezoelectric layer MEMS microphone.

Description of the Related Art

A MEMS microphone is a micro-machined electromechanical device used to convert sound pressure (e.g., voice sound) to an electrical signal (e.g., voltage). MEMS microphones are widely used in mobile devices, headsets, smart speakers and other voice-interface devices or systems. Conventional capacitive MEMS microphones suffer from high power consumption (e.g., large bias voltage) and reliability, for example when used in a harsh environment (e.g., when exposed to dust and/or water).

Piezoelectric MEMS microphones have been used to address the deficiencies of capacitive MEMS microphones. Piezoelectric MEMS microphones offer a constant listening capability while consuming almost no power (e.g., no bias voltage is needed), are robust and immune to water and dust contamination. Existing piezoelectric MEMS microphones are based on either a cantilever MEMS structure or a diaphragm MEMS structure, and is mostly based on sputter-deposited thin film piezoelectric structure. Such thin piezoelectric film suffers from large residual stress after deposition which results in sensitivity degradation and variation.

The cantilever MEMS structure suffers from poor low-frequency roll-off control as the gap between cantilevers varies due to cantilever deflection induced by residual stress. Additionally, the cantilever MEMS structure with gap control mechanism can have a complex structure that results in higher manufacturing costs and poor reliability performance. The diaphragm MEMS structure provides better low-frequency roll-off control and higher sensitivity than the cantilever MEMS structure, but suffers from sensitivity variation as residual stress causes large tensile or compression stresses within the diaphragm (e.g., a small residual stress results in a large sensitivity degradation for diaphragm type piezoelectric MEMS microphone).

SUMMARY

Accordingly, there is a need for an improved piezoelectric MEMS microphone that does not suffer the deficiencies in existing MEMS cantilever and diaphragm structures.

In accordance with one aspect of the disclosure, a piezoelectric MEMS microphone has a single layer of stress-free piezoelectric film. The single layer piezoelectric film is formed from a piezoelectric substrate or wafer via, for example, wafer-bonding techniques (e.g., direct or adhesive bonding techniques) and thinning techniques (e.g., ion slicing, Chemical Mechanical Polishing (CMP)). Advantageously, the stress-free single-layer piezoelectric MEMS microphone can provide one or more of high and uniform sensitivity, precise low-frequency roll-off control, low part to part variation and high yield (e.g., zero stress variation across the wafer).

In accordance with one aspect of the disclosure, a piezoelectric microelectromechanical systems microphone is provided. The microphone comprises a substrate defining an opening between a bottom end of the substrate and a top end of the substrate. The microphone also comprises a single piezoelectric film layer disposed over the top end of the substrate and defining a diaphragm structure. The single piezoelectric film layer being substantially flat with substantially zero residual stress. The microphone also comprises an electrode disposed over the diaphragm structure. The diaphragm structure is configured to deflect when subjected to sound pressure via the opening in the substrate.

In accordance with another aspect of the disclosure, a radiofrequency module is provided. The radiofrequency module comprises a printed circuit board including a substrate layer. The radiofrequency module also comprises one or more piezoelectric microelectromechanical systems microphones mounted on the printed circuit board. Each microphone includes a substrate defining an opening between a bottom end of the substrate and a top end of the substrate. A single piezoelectric film layer is disposed over the top end of the substrate and defines a diaphragm structure, the single piezoelectric film layer being substantially flat with substantially zero residual stress. An electrode is disposed over the diaphragm structure. The diaphragm structure is configured to deflect when subjected to sound pressure via the opening in the substrate.

In accordance with another aspect of the disclosure, a wireless mobile device is provided. The wireless mobile device comprises one or more antennas, a front end system that communicates with the one or more antennas, and one or more one or more piezoelectric microelectromechanical systems microphones mounted on a substrate layer. Each microphone includes a substrate defining an opening between a bottom end of the substrate and a top end of the substrate. A single piezoelectric film layer is disposed over the top end of the substrate and defines a diaphragm structure, the single piezoelectric film layer being substantially flat with substantially zero residual stress. An electrode is disposed over the diaphragm structure. The diaphragm structure is configured to deflect when subjected to sound pressure via the opening in the substrate.

In accordance with another aspect of the disclosure, a method of making a piezoelectric microelectromechanical systems microphone is provided. The method comprises the steps of: a) oxidizing a top surface and a bottom surface of a substrate to form a top oxidation layer and a bottom oxidation layer, b) applying a piezoelectric wafer over the top surface of the substrate, the piezoelectric wafer defining a substantially flat structure with substantially zero residual stress, c) thinning the piezoelectric wafer to define a single piezoelectric film layer that defines a substantially flat diaphragm structure with substantially zero residual stress, d) forming or applying an electrode over the single piezoelectric film layer, and e) etching the bottom oxidation layer and substrate to form an opening in the substrate. The opening allows sound pressure to travel through the opening to deflect the diaphragm structure.

In accordance with another aspect of the disclosure, a method of making a radiofrequency module is provided. The method comprises the steps of forming or providing a printed circuit board that includes a substrate layer, and forming or providing one or more piezoelectric microelectromechanical systems microphones. The process of forming or providing one or more piezoelectric microelectromechanical systems microphones comprises: (a) oxidizing a top surface and a bottom surface of a substrate to form a top oxidation layer and a bottom oxidation layer, (b) applying a piezoelectric wafer over the top surface of the substrate, the piezoelectric wafer defining a substantially flat structure with substantially zero residual stress, (c) thinning the piezoelectric wafer to define a single piezoelectric film layer that defines a substantially flat diaphragm structure with substantially zero residual stress, (d) forming or applying an electrode over the single piezoelectric film layer, and (e) etching the bottom oxidation layer and substrate to form an opening in the substrate. The opening allows sound pressure to travel through the opening to deflect the diaphragm structure. The method of making the radiofrequency module also comprises the step of mounting the one or more piezoelectric microelectromechanical systems microphones on the printed circuit board.

BRIEF DESCRIPTION OF THE DRAWINGS

FIG. 9E is a cross-sectional side view of another step in the manufacture of a piezoelectric MEMS microphone.

FIG. 9F is a cross-sectional side view of another step in the manufacture of a piezoelectric MEMS microphone.

FIG. 9G is a cross-sectional side view of another step in the manufacture of a piezoelectric MEMS microphone.

FIG. 9H is a cross-sectional side view of another step in the manufacture of a piezoelectric MEMS microphone.

FIG. 9I is a cross-sectional side view of another step in the manufacture of a piezoelectric MEMS microphone.

FIG. 9J is a cross-sectional side view of another step in the manufacture of a piezoelectric MEMS microphone.

FIG. 10E is a cross-sectional side view of another step in the manufacture of a piezoelectric MEMS microphone.

FIG. 10F is a cross-sectional side view of another step in the manufacture of a piezoelectric MEMS microphone.

FIG. 10G is a cross-sectional side view of another step in the manufacture of a piezoelectric MEMS microphone.

FIG. 10H is a cross-sectional side view of another step in the manufacture of a piezoelectric MEMS microphone.

FIG. 10I is a cross-sectional side view of another step in the manufacture of a piezoelectric MEMS microphone.

FIG. 10J is a cross-sectional side view of another step in the manufacture of a piezoelectric MEMS microphone.

DETAILED DESCRIPTION

Figure 1:
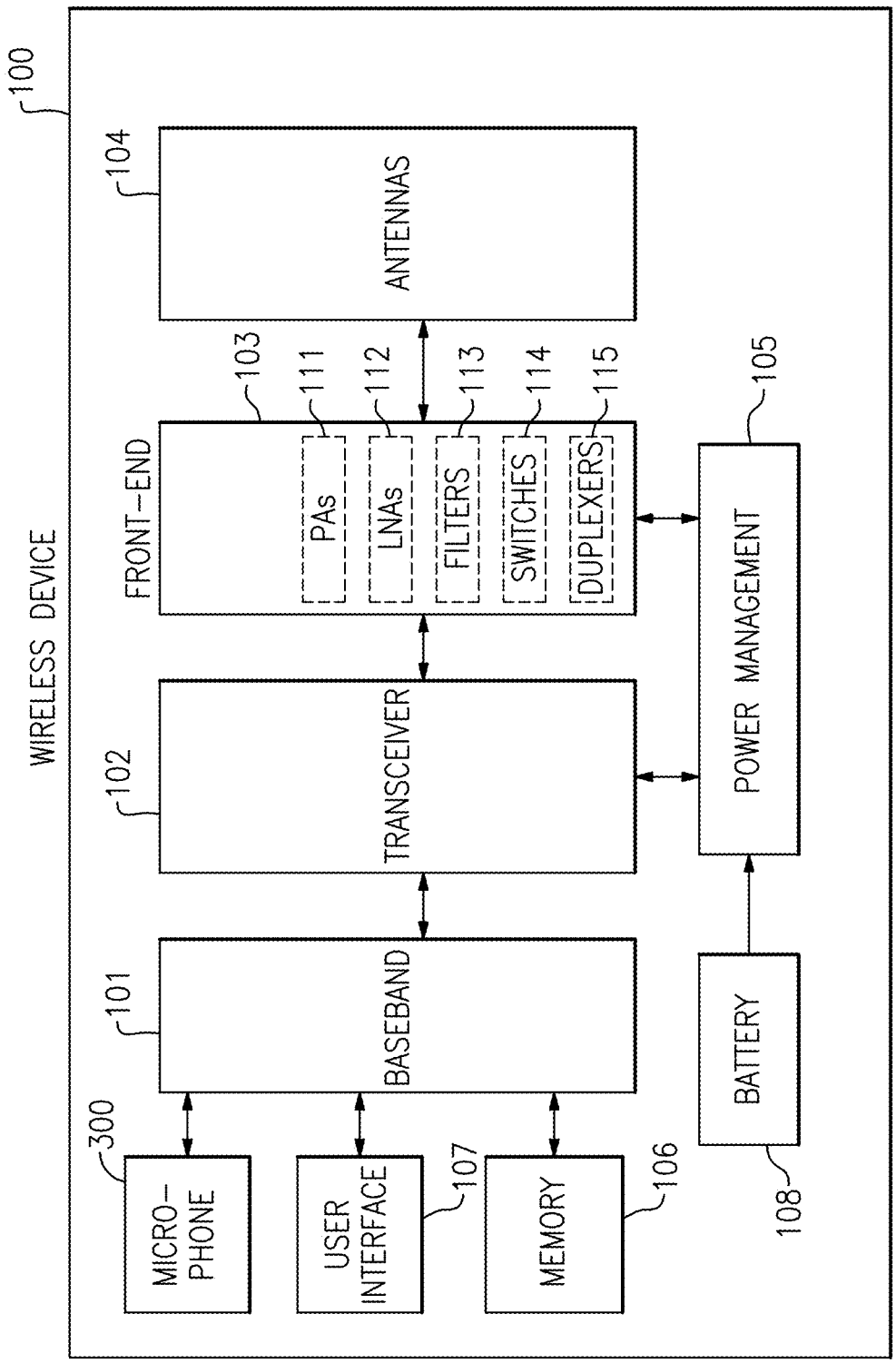
FIG. 1 is a schematic diagram of one embodiment of a wireless device.

The following detailed description of certain embodiments presents various descriptions of specific embodiments. However, the innovations described herein can be embodied in a multitude of different ways, for example, as defined and covered by the claims. In this description, reference is made to the drawings were like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet-of-Things (NB-IOT), Vehicle-to-Everything (V2X), and High Power User Equipment (HPUE).

3GPP introduced Phase 1 of fifth generation (5G) technology in Release 15 and plans to introduce Phase 2 of 5G technology in Release 16 (targeted for 2019). Subsequent 3GPP releases will further evolve and expand 5G technology. 5G technology is also referred to herein as 5G New Radio (NR).

5G NR supports or plans to support a variety of features, such as communications over millimeter wave spectrum, beam forming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

FIG. 1 is a schematic diagram of one embodiment of a wireless device 100. The wireless device 100 can be, for example but not limited to, a portable telecommunication device such as a mobile cellular-type telephone. The wireless device 100 can include one or more of a baseband system 101, a transceiver 102, a front end system 103, one or more antennas 104, a power management system 105, a memory 106, a user interface 107, a battery 108 (e.g., direct current (DC) battery), and a microphone 300 (e.g., a piezoelectric MEMS microphone). Other additional components, such as a speaker, display and keyboard can optionally be connected to the baseband system 101. The battery 108 can provide power to the wireless device 100. The microphone 300 can supply signals to the baseband system 101.

It should be noted that, for simplicity, only certain components of the wireless device 100 are illustrated herein. The control signals provided by the baseband system 101 control the various components within the wireless device 100. Further, the function of the transceiver 102 can be integrated into separate transmitter and receiver components.

The wireless device 100 can be used communicate using a wide variety of communications technologies, including, but not limited to, 2G, 3G, 4G (including LTE, LTE-Advanced, and LTE-Advanced Pro), 5G NR, WLAN (for instance, Wi-Fi), WPAN (for instance, Bluetooth and ZigBee), WMAN (for instance, WiMax), and/or GPS technologies.

The transceiver 102 generates RF signals for transmission and processes incoming RF signals received from the antennas 104. It will be understood that various functionalities associated with the transmission and receiving of RF signals can be achieved by one or more components that are collectively represented in FIG. 1 as the transceiver 102. In one example, separate components (for instance, separate circuits or dies) can be provided for handling certain types of RF signals.

The front end system 103 aids in conditioning signals transmitted to and/or received from the antennas 104. In the illustrated embodiment, the front end system 103 includes one or more power amplifiers (PAs) 111, low noise amplifiers (LNAs) 112, filters 113, switches 114, and duplexers 115. However, other implementations are possible.

For example, the front end system 103 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the wireless device 100 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 104 can include antennas used for a wide variety of types of communications. For example, the antennas 104 can include antennas for transmitting and/or receiving signals associated with a wide variety of frequencies and communications standards.

In certain implementations, the antennas 104 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The wireless device 100 can operate with beamforming in certain implementations. For example, the front end system 103 can include phase shifters having variable phase controlled by the transceiver 102. Additionally, the phase shifters are controlled to provide beam formation and directivity for transmission and/or reception of signals using the antennas 104. For example, in the context of signal transmission, the phases of the transmit signals provided to the antennas 104 are controlled such that radiated signals from the antennas 104 combine using constructive and destructive interference to generate an aggregate transmit signal exhibiting beam-like qualities with more signal strength propagating in a given direction. In the context of signal reception, the phases are controlled such that more signal energy is received when the signal is arriving to the antennas 104 from a particular direction. In certain implementations, the antennas 104 include one or more arrays of antenna elements to enhance beamforming.

The baseband system 101 is coupled to the user interface 107 to facilitate processing of various user input and output (I/O), such as voice and data. The baseband system 101 provides the transceiver 102 with digital representations of transmit signals, which the transceiver 102 processes to generate RF signals for transmission. The baseband system 101 also processes digital representations of received signals provided by the transceiver 102. As shown in FIG. 1, the baseband system 101 is coupled to the memory 106 of facilitate operation of the wireless device 100.

The memory 106 can be used for a wide variety of purposes, such as storing data and/or instructions to facilitate the operation of the wireless device 100 and/or to provide storage of user information.

The power management system 105 provides a number of power management functions of the wireless device 100. In certain implementations, the power management system 105 includes a PA supply control circuit that controls the supply voltages of the power amplifiers 111. For example, the power management system 105 can be configured to change the supply voltage(s) provided to one or more of the power amplifiers 111 to improve efficiency, such as power added efficiency (PAE).

As shown in FIG. 1, the power management system 105 receives a battery voltage from the battery 108. The battery 108 can be any suitable battery for use in the wireless device 100, including, for example, a lithium-ion battery.

Figure 2A:
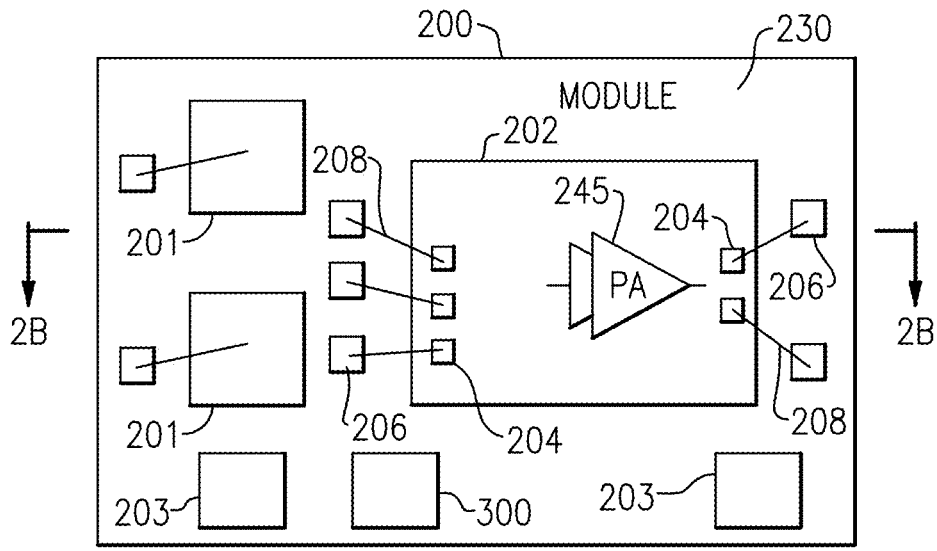
FIG. 2A is a schematic diagram of one embodiment of a packaged module.
Figure 2B:
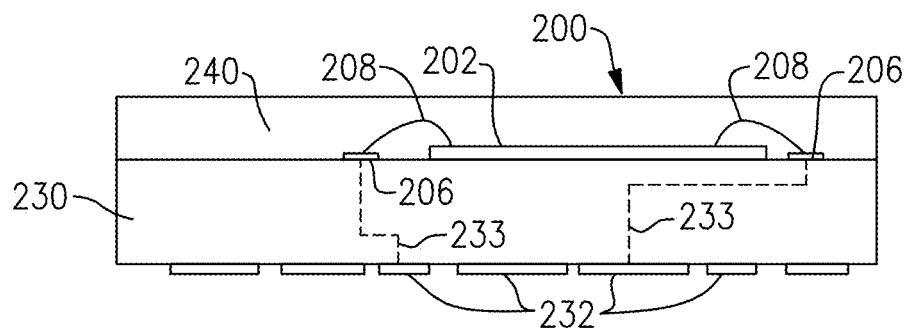
FIG. 2B is a schematic diagram of a cross-section of the packaged module of FIG. 2A taken along the lines 2B-2B.

FIG. 2A is a schematic diagram of one embodiment of a packaged module 200. FIG. 2B is a schematic diagram of a cross-section of the packaged module 200 of FIG. 2A taken along the lines 2B-2B.

The packaged module 200 includes radio frequency components 201, a semiconductor die 202, surface mount devices 203, wirebonds 208, a package substrate 230, and an encapsulation structure 240. One or more of the surface mounted devices (SMDs) 203 can be a microphone 300 (e.g., a piezoelectric MEMS microphone). The package substrate 230 includes pads 206 formed from conductors disposed therein. Additionally, the semiconductor die 202 includes pins or pads 204, and the wirebonds 208 have been used to connect the pads 204 of the die 202 to the pads 206 of the package substrate 220.

The semiconductor die 202 includes a power amplifier 245, which can be implemented in accordance with one or more features disclosed herein.

The packaging substrate 230 can be configured to receive a plurality of components such as radio frequency components 201, the semiconductor die 202 and the surface mount devices 203, which can include, for example, surface mount capacitors and/or inductors. In one implementation, the radio frequency components 201 include integrated passive devices (IPDs).

As shown in FIG. 2B, the packaged module 200 is shown to include a plurality of contact pads 232 disposed on the side of the packaged module 200 opposite the side used to mount the semiconductor die 202. Configuring the packaged module 200 in this manner can aid in connecting the packaged module 200 to a circuit board, such as a phone board of a mobile device. The example contact pads 232 can be configured to provide radio frequency signals, bias signals, and/or power (for example, a power supply voltage and ground) to the semiconductor die 202 and/or other components. As shown in FIG. 2B, the electrical connections between the contact pads 232 and the semiconductor die 202 can be facilitated by connections 233 through the package substrate 230. The connections 233 can represent electrical paths formed through the package substrate 220, such as connections associated with vias and conductors of a multilayer laminated package substrate.

In some embodiments, the packaged module 200 can also include one or more packaging structures to, for example, provide protection and/or facilitate handling. Such a packaging structure can include overmold or encapsulation structure 240 formed over the packaging substrate 230 and the components and die(s) disposed thereon.

It will be understood that although the packaged module 200 is described in the context of electrical connections based on wirebonds, one or more features of the present disclosure can also be implemented in other packaging configurations, including, for example, flip-chip configurations.

Piezoelectric MEMS Microphone

Figure 3:
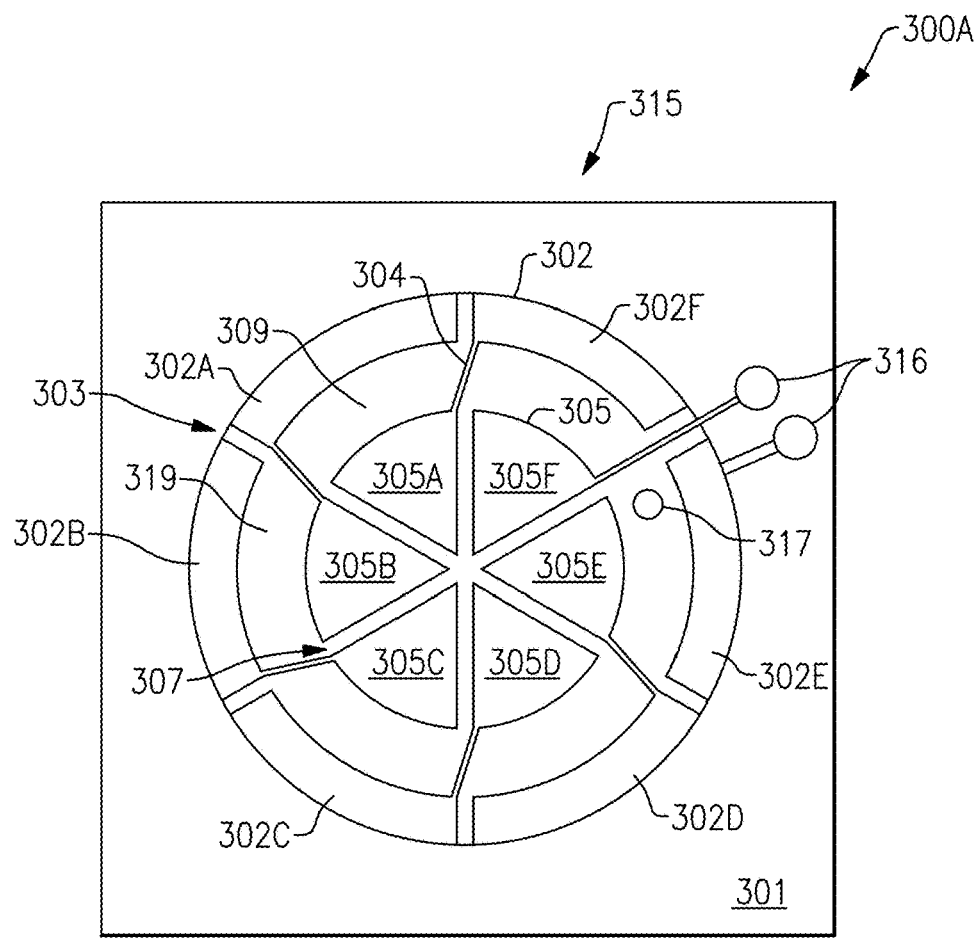
FIG. 3 is a top view of a piezoelectric MEMS circular microphone.
Figure 4:
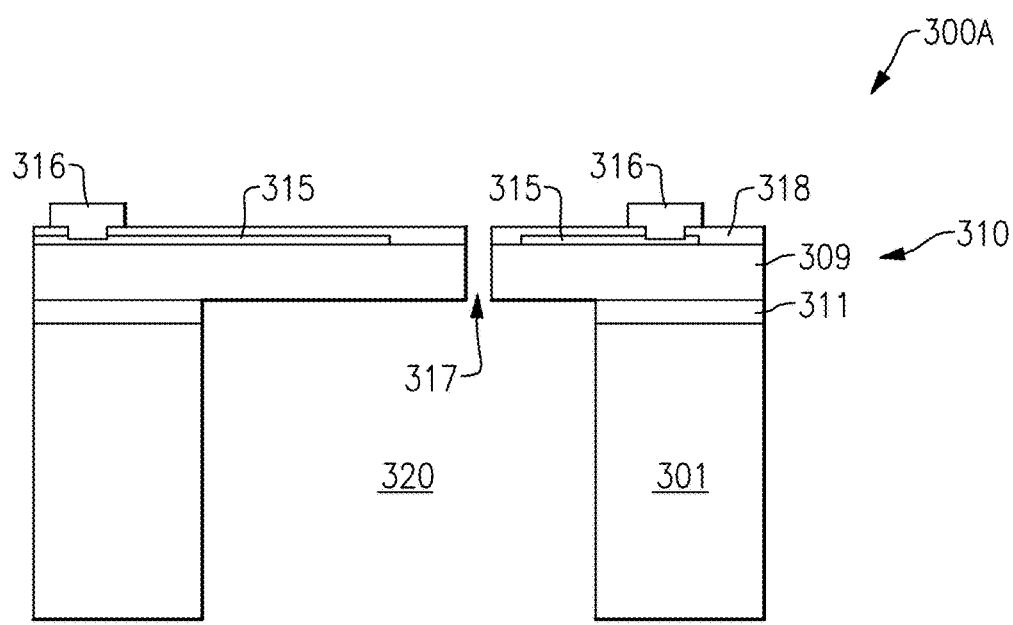
FIG. 4 is a cross-sectional side view of the piezoelectric MEMS microphone of FIG. 3.

FIGS. 3-4 show one implementation of a piezoelectric microelectromechanical systems (MEMS) microphone 300A (hereinafter the "microphone"). The microphone 300A is optionally a piezoelectric MEMS diaphragm microphone 300A. The microphone 300A has a substrate 301. The substrate 301 is optionally made of Silicon. An insulation layer 311 is disposed on a surface of the substrate 301. The insulation layer 311 is optionally silicon dioxide.

A piezoelectric film layer 309 (e.g., a single piezoelectric film layer 309) is disposed (e.g., adhered) on the oxide layer 311. The piezoelectric film layer 309 is substantially stress-free (e.g., has zero residual stress) and is optionally formed from a piezoelectric substrate 310. Optionally, the piezoelectric substrate 310 is planar (e.g., flat). In one implementation, the piezoelectric substrate 310 is made of Lithium Niobate (LiNbO3). In another implementation, the piezoelectric substrate 310 is made of Lithium Tantalate (LiTaO3). The piezoelectric substrate 310 is used to form the piezoelectric film 309 (e.g., that is substantially stress-free, that has zero residual stress) via wafer-bonding techniques (e.g., direct or adhesive bonding) and thinning techniques (e.g., ion slicing and Chemical Mechanical Polishing (CMP)), as further discussed below. Advantageously, the stress-free single layer piezoelectric MEMS microphone 300A can provide one or more of a high and uniform sensitivity, precise low-frequency roll-off control, low part to part variation and high yield (e.g., zero stress variation across the wafer).

An electrode 315 (e.g., a "top" electrode) is disposed on top of the piezoelectric film layer 309, and a passivation layer 318 is disposed over the electrode 315 and at least partially defines a top surface of the microphone 300A. Optionally, the electrode 315 is made of Molybdenum (Mo). In one implementation, the passivation layer 318 is optionally titanium nitride (TiN). The piezoelectric film layer (e.g., the single piezoelectric film layer) 309 defines a diaphragm 319.

With reference to FIG. 3, the microphone 300A can have a generally circular or round shape. However, as discussed further below, the microphone 300A can have other suitable shapes. The electrode 315 can include an outer circumferential electrode 302 and a center electrode 305. The outer circumferential electrode 302 can optionally be divided into two or more portions 302A-302F (e.g., six portions) by one or more gaps 303 between the portions 302A-302F. Optionally, the gaps 303 can completely separate the portions 302A-302F. The center electrode 305 can optionally be divided into two or more portions 305A-305F (e.g., six portions) by one or more gaps 307 between the portions 305A-305F.

The number of portions that the center electrode 305 and outer circumferential electrode 302 are divided into can be determined via a simulation starting with a single center electrode and a single outer circumferential electrode to evaluate output voltage distribution relative to degrees around the circumference of the electrodes 302, 305. The number of portions that the center electrode 305 and outer circumferential electrode 302 are divided into can also depend on a cut angle of the piezoelectric substrate or wafer 310. Though FIGS. 3-4 show the center electrode 305 and outer circumferential electrode 302 divided into six portions each 305A-305F, 302A-302F, the number of portions can vary (e.g., based on the cut angle of the piezoelectric wafer 310).

Optionally, the gaps 307 can completely separate the portions 305A-305F. The gaps 303 can advantageously control the amount of capacitance provided by the electrodes 302 (e.g., if want a higher capacitance then fewer gaps 303 are provided; if want a lower capacitance then more gaps 303 are provided). The reduction in capacitance (e.g., due to increased number of gaps 303) results in increased sensitivity, and the increase in capacitance (e.g., due to reduced number of gaps 303) results in reduced sensitivity. Therefore, sensitivity and capacitance can advantageously be balanced as desired via the use of such gaps 303, 307 to divide the electrodes 302, 305.

With reference to FIG. 3, each of the portions 305A-305F of the center electrode 305 is connected in series with one of the portions 302A-302F of the circumferential electrode 302 via a connection via 304. The microphone 300A can have one or more bond pads 316 connected to the circumferential electrode 302 and center electrode 305. Each of the center electrode portions 305A-305F defines a capacitor with an opposing outer circumferential electrode portion 302A-302F with the piezoelectric film 309 in between, where the center electrode portions 305A-305F have a different polarity than the outer circumferential electrode portions 302A-302F, the electric field extends horizontally (along same plane) and lateral capacitance exists between the center electrode portions 305A-305F and the outer circumferential electrode portions 302A-302F.

With respect to FIG. 3, the electrical signal travels laterally (e.g., along same plane) from one bond pad 316 to center electrode portion 305F, then to outer circumferential electrode portion 302F via the piezoelectric film 309, then to center electrode portion 305A via connector 304, then to outer circumferential electrode portion 302A via the piezoelectric film 309, then to center electrode portion 305B via connector 304, then to outer circumferential electrode portion 302B via the piezoelectric film 309, then to center electrode portion 305C via connector 304, then to outer circumferential electrode portion 302C via the piezoelectric film 309, then to center electrode portion 305D via connector 304, then to outer circumferential electrode portion 302D via the piezoelectric film 309, then to center electrode portion 305E via connector 304, then to outer circumferential electrode portion 302E via the piezoelectric film 309, then to bond pad 316.

The center electrode 305 can be spaced from the circumferential electrode 302 so that the center electrode 305 is substantially centered relative to the circumferential electrode 302 (e.g., both electrodes 302, 305 have the same central axis), with at least a portion of the diaphragm 319 extending between the circumferential electrode 302 and the center electrode 305. As shown in FIGS. 3-4, the diaphragm 319 can extend beneath the circumferential electrode 302 and beneath the center electrode 305 of the electrode 315. A through hole 317 can be formed (e.g., etched) in the diaphragm 319 (e.g., in the piezoelectric film layer 309 that defines the diaphragm 319) at a location between the circumferential electrode 302 and the center electrode 305. The through hole 317 can extend from a top surface of the diaphragm 319 to a bottom surface of the diaphragm 319 to thereby extend completely through the diaphragm 319. The microphone 300A can have an opening 320 in the substrate 301 that is located underneath the diaphragm 319, which allows the diaphragm 319 to move (e.g., deflect).

With continued reference to FIG. 3, the electrodes 302, 305 are advantageously located (e.g., electrode 302 along the periphery and electrode 305 at the center of the diaphragm structure 319) where the highest stress, therefore highest output voltage or electrical energy via piezoelectric effect, is induced by sound pressure exerted on the diaphragm 319 (e.g., via air pressure delivered through the opening 320 toward the diaphragm 319). As discussed further below, the piezoelectric film layer 309 can be a single layer that is substantially stress-free (e.g., that has zero residual stress).

Advantageously, the piezoelectric MEMS microphone 300A has a simplified manufacturing process (i.e., is simpler to manufacture), for example because only a top layer of electrodes is used (i.e., do not use a separate, such as middle or lower, layer of electrodes). However, the piezoelectric MEMS microphone 300A exhibits a smaller capacitance than microphones with multiple layers of electrodes (such as piezoelectric MEMS microphone 300C, described further below). For example, the piezoelectric MEMS microphone 300A can exhibit a capacitance level that is 1-2 orders of magnitude lower than similar microphones with multiple layers of electrodes.

Figure 5:
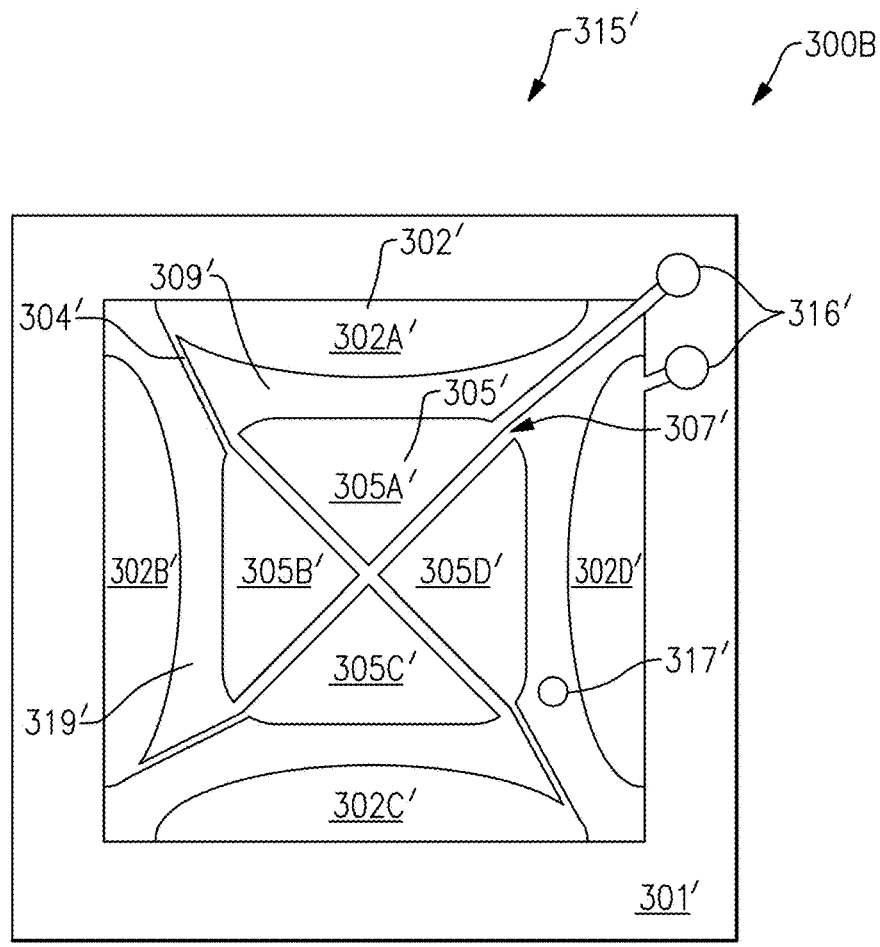
FIG. 5 is a top view of a piezoelectric MEMS rectangular microphone.
Figure 6:
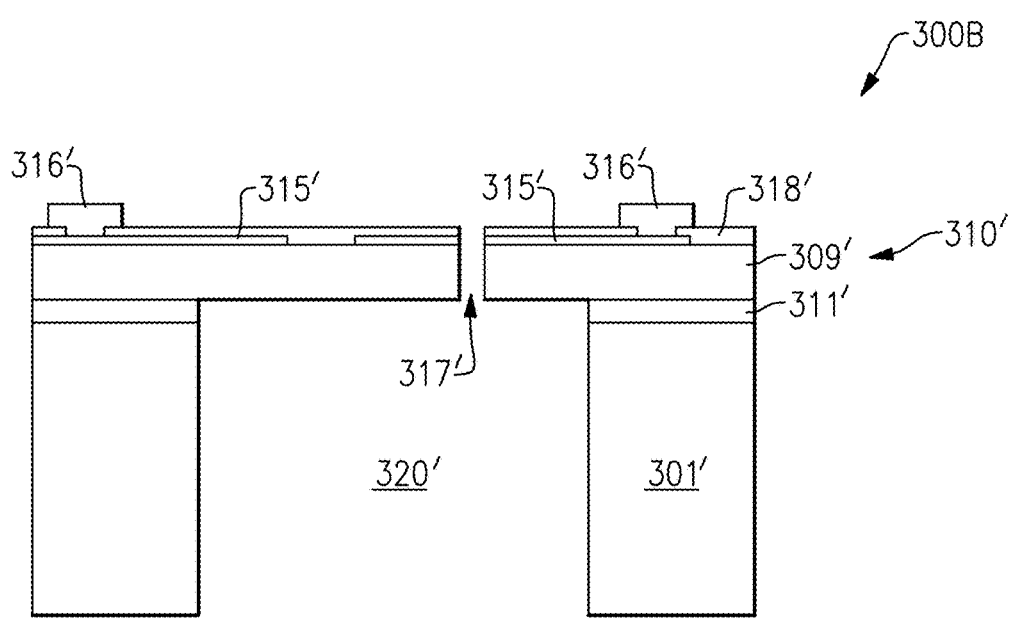
FIG. 6 is a cross-sectional side view of the piezoelectric MEMS microphone of FIG. 5.

FIGS. 5-6 show another implementation of a piezoelectric microelectromechanical systems (MEMS) microphone 300B (hereinafter the "microphone"). The microphone 300B is optionally a piezoelectric MEMS diaphragm microphone 300B. The substrate 301' is optionally made of Silicon. An insulation layer 311' is disposed on a surface of the substrate 301'. The insulation layer 311' is optionally Silicon dioxide. A piezoelectric film layer 309' (e.g., a single piezoelectric film layer) is disposed on the insulation layer 311'. The piezoelectric film layer 309' is optionally made from a piezoelectric substrate 310'. In one implementation, the piezoelectric substrate 310' is made of Lithium Niobate (LiNbO3). In another implementation, the piezoelectric substrate 310' is made of Lithium Tantalate (LiTaO3). An electrode 315' (e.g., a "top" electrode) is disposed on top of the piezoelectric film layer 309', and a passivation layer 318' is disposed over the electrode 315' and at least partially defines a top surface of the microphone 300B. In one implementation, the passivation layer 318' is optionally titanium nitride (TiN). The piezoelectric film layer 309' (e.g. the single piezoelectric film layer) defines a diaphragm 319'.

With reference to FIG. 5, the microphone 300B can have a generally rectangular (e.g., square) shape. However, the microphone 300B can have other suitable shapes. The electrode 315' can include one or more side electrodes 302' adjacent one or more sides of the diaphragm 319' and one or more center electrodes 305'. In FIG. 5, the electrode 315' includes four side electrodes 302A'-302D', each adjacent a side of the rectangular (e.g., square) shape of the diaphragm 319'. Each of the side electrodes 302' can optionally be a single piece (e.g., not divided into different portions by one or more gaps between the portions). The gaps can advantageously control the amount of capacitance provided by the electrodes 302' (e.g., if want a higher capacitance then fewer gaps are provided; if want a lower capacitance then more gaps are provided). The reduction in capacitance (e.g., due to increased number of gaps) results in increased sensitivity, and the increase in capacitance (e.g., due to reduced number of gaps) results in reduced sensitivity. Therefore, sensitivity and capacitance can advantageously be balanced as desired via the use of such gaps to divide the electrodes 302'.

The center electrode 305' can optionally be divided into two or more portions 305A'-305D' (e.g., four portions) by one or more gaps 307' between the portions 305A'-305D'. Optionally, the gaps 307' can completely separate the portions 305A'-305D'. The gaps 307' can advantageously control the amount of capacitance provided by the electrodes 3'05 (e.g., if want a higher capacitance then fewer gaps 307' are provided; if want a lower capacitance then more gaps 307' are provided). The reduction in capacitance (e.g., due to increased number of gaps 307') results in increased sensitivity, and the increase in capacitance (e.g., due to reduced number of gaps 307') results in reduced sensitivity. Therefore, sensitivity and capacitance can advantageously be balanced as desired via the use of such gaps 307' to divide the electrode 305'.

With reference to FIG. 5, each of the portions 305A'-305D' of the center electrode 305' is connected in series with one of the side electrodes 302A'-302D' via a connection via 304'. The microphone 300B can have one or more bond pads 316' connected to the peripheral electrode 302' and center electrode 305'.

The number of portions that the center electrode 305' and side electrode 302' are divided into can be determined via a simulation starting with a single center electrode and a single outer peripheral electrode to evaluate output voltage distribution relative to degrees around the circumference of the electrodes 302', 305'. The number of portions that the center electrode 305' and outer peripheral electrode 302' are divided into can also depend on a cut angle of the piezoelectric substrate or wafer 310'. Though FIGS. 5-6 show the center electrode 305' and outer peripheral electrode 302' divided into four portions each 305A'-305D', 302A-302F, the number of portions can vary (e.g., based on the cut angle of the piezoelectric wafer 310').

Optionally, the gaps 307' can completely separate the portions 305A'-305D'. The gaps 303' can advantageously control the amount of capacitance provided by the electrodes 302' (e.g., if want a higher capacitance then fewer gaps 303' are provided; if want a lower capacitance then more gaps 303' are provided). The reduction in capacitance (e.g., due to increased number of gaps 303') results in increased sensitivity, and the increase in capacitance (e.g., due to reduced number of gaps 303') results in reduced sensitivity. Therefore, sensitivity and capacitance can advantageously be balanced as desired via the use of such gaps 303', 307' to divide the electrodes 302', 305'.

With reference to FIG. 5, each of the portions 305A'-305D' of the center electrode 305' is connected in series with one of the portions 302A'-302D' of the peripheral electrode 302' via a connection via 304'. The microphone 300B can have one or more bond pads 316' connected to the peripheral electrode 302' and center electrode 305'. Each of the center electrode portions 305A-305D' defines a capacitor with an opposing side electrode portion 302A'-302D' with the piezoelectric film 309' in between, where the center electrode portions 305A'-305D' have a different polarity than the side electrode portions 302A'-302D', the electric field extends horizontally (along same plane) and lateral capacitance exists between the center electrode portions 305A'-305D' and the side electrode portions 302A'-302D'.

With respect to FIG. 5, the electrical signal travels laterally (e.g., along same plane) from one bond pad 316' to center electrode portion 305A', then to side electrode portion 302A' via the piezoelectric film 309', then to center electrode portion 305B' via connector 304', then to side electrode portion 302B' via the piezoelectric film 309', then to center electrode portion 305C' via connector 304', then to side electrode portion 302C' via the piezoelectric film 309', then to center electrode portion 305D' via connector 304', then to side electrode portion 302D', then to bond pad 316'.

The center electrode 305' can be spaced from the peripheral electrode 302' so that the center electrode 305' is substantially centered relative to the peripheral electrode 302' (e.g., both electrodes 302', 305' have the same central axis), with at least a portion of the diaphragm 319' extending between the peripheral electrode 302' and the center electrode 305'. As shown in FIGS. 5-6, the diaphragm 319' can extend beneath the peripheral electrode 302' and beneath the center electrode 305' of the electrode 315'. A through hole 317' can be formed (e.g., etched) in the diaphragm 319' (e.g., in the piezoelectric film layer 309' that defines the diaphragm 319') at a location between the peripheral electrode 302' and the center electrode 305'. The through hole 317' can extend from a top surface of the diaphragm 319' to a bottom surface of the diaphragm 319' to thereby extend completely through the diaphragm 319'. The microphone 300B can have an opening 320' in the substrate 301' that is located underneath the diaphragm 319', which allows the diaphragm 319' to move (e.g., deflect).

With continued reference to FIG. 5, the electrodes 302', 305' are advantageously located (e.g., electrode 302' along the periphery and electrode 305' at the center of the diaphragm structure 319') where the highest stress, therefore highest output voltage or electrical energy via piezoelectric effect, is induced by sound pressure exerted on the diaphragm 319' (e.g., via air pressure delivered through the opening 320' toward the diaphragm 319'). As discussed further below, the piezoelectric film layer 309' can be a single layer that is substantially stress-free (e.g., that has zero residual stress).

As shown in FIGS. 5-6, the diaphragm 319' can extend beneath the peripheral electrode 302' and beneath the center electrode 305'. A through hole 317' can be formed (e.g., etched) in the diaphragm 319' (e.g., in the piezoelectric film layer 309' that defines the diaphragm 319') at a location between the peripheral electrode 302' and the center electrode 305'. The through hole 317' can extend from a top surface of the diaphragm 319' to a bottom surface of the diaphragm 319' to thereby extend completely through the diaphragm 319'. The microphone 300B can have an opening 320' in the substrate 301' that is located underneath the diaphragm 319', which allows the diaphragm 319' to move.

With continued reference to FIG. 5, the electrodes 302', 305' are advantageously located where the highest stress is induced, therefore highest output voltage or electrical energy via piezoelectric effect, (e.g., along the sides and center of the diaphragm structure 319') by sound pressure exerted on the diaphragm 319' (e.g., via air pressure delivered through the opening 320' toward the diaphragm 319'). As discussed further below, the one or more piezoelectric film layers 309' can be a single layer that is substantially stress free (e.g., has zero residual stress), thereby advantageously providing a diaphragm structure 319' with approximately zero (e.g., zero) residual stress.

Figure 7:
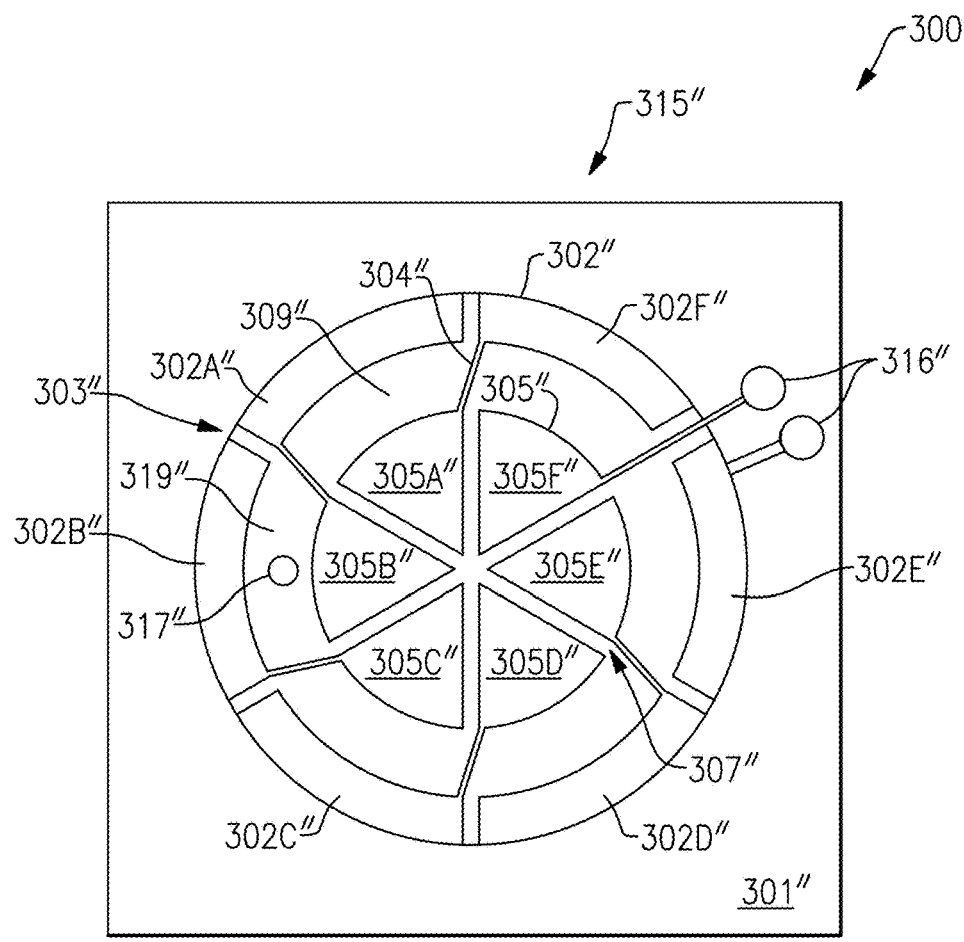
FIG. 7 is a top view of a piezoelectric MEMS circular microphone.
Figure 8:
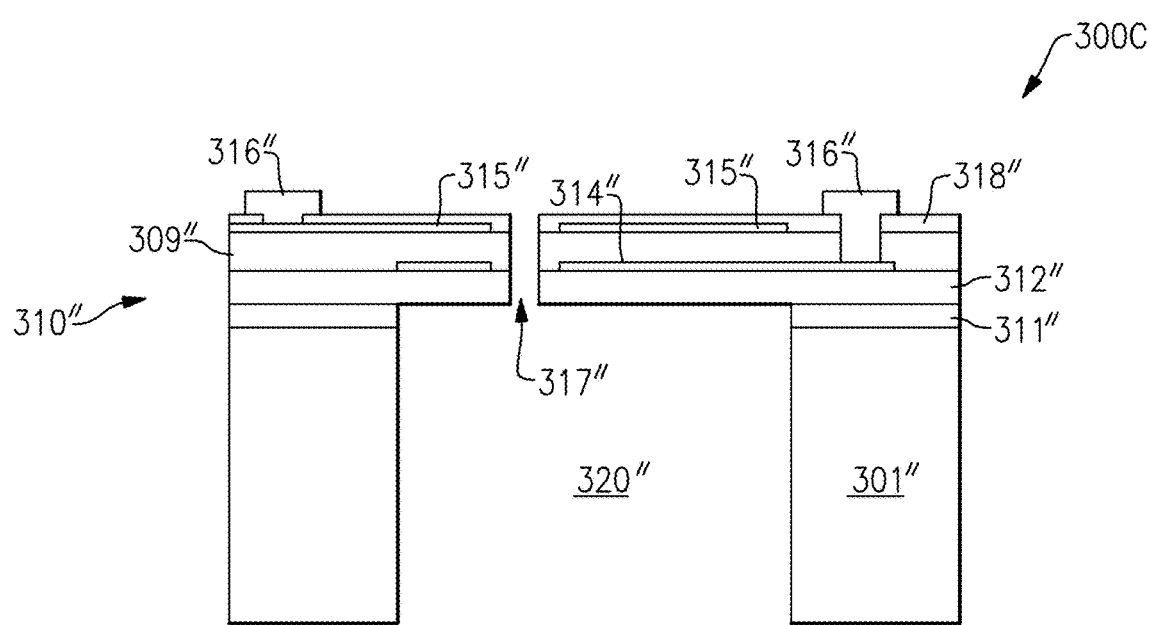
FIG. 8 is a cross-sectional side view of the piezoelectric MEMS microphone of FIG. 8.

FIGS. 7-8 show one implementation of a piezoelectric microelectromechanical systems (MEMS) microphone 300C (hereinafter the "microphone"). The microphone 300C is optionally a piezoelectric MEMS diaphragm microphone 300C. The microphone 300C has a substrate 301". The substrate 301" is optionally made of Silicon. An insulation layer 311" is disposed on a surface of the substrate 301". The insulation layer 311" is optionally silicon dioxide. An elastic layer 312" is disposed on the insulation layer 311". The elastic layer 312" can optionally be made of Silicon Nitride. In another implementation, the elastic layer 312" can be made of a suitable or compatible dielectric material. The elastic layer 312" advantageously shifts a neutral axis of the piezoelectric MEMS microphone 300C, allowing a signal to be output between the middle electrode 314" and top electrode 315" since they would have opposing polarities.

A first electrode 314" (e.g., a "middle" electrode) is disposed over the elastic layer 312". A piezoelectric film layer 309" (e.g., a single piezoelectric film layer 309") is disposed on the first electrode 314". The piezoelectric film layer 309" is optionally made from a piezoelectric substrate 310". In one implementation, the piezoelectric substrate 310" is made of Lithium Niobate (LiNbO3). In another implementation, the piezoelectric substrate 310' is made of Lithium Tantalate (LiTaO3). A second electrode 315" (e.g., a "top" electrode) is disposed on top of the piezoelectric film layer 309", and a passivation layer 318" is disposed over the second electrode 315" and at least partially defines a top surface of the microphone 300C. In one implementation, the passivation layer 318" is optionally titanium nitride (TiN). The piezoelectric film layer 309" and elastic layer 312" define a diaphragm 319". One or both of the first and second electrodes 314", 315" can optionally be made of Molybdenum.

With reference to FIG. 7, the microphone 300C can have a generally circular or round shape. However, as discussed further herein, the microphone 300C can have other suitable shapes. The second electrode 315" can include an outer circumferential electrode 302" and a center electrode 305". The outer circumferential electrode 302" can optionally be divided into two or more portions (e.g., six portions) 302A"-302F" by one or more gaps 303" between the portions 302A"-302F". Optionally, the gaps 303" can completely separate the portions 302A"-302F". The center electrode 305" can optionally be divided into two or more portions (e.g., six portions) 305A"-305F" by one or more gaps 307" between the portions 305A"-305F".

The gaps 303" can advantageously control the amount of capacitance provided by the electrodes 302" (e.g., if want a higher capacitance then fewer gaps 303" are provided; if want a lower capacitance then more gaps 303" are provided). The reduction in capacitance (e.g., due to increased number of gaps 303") results in increased sensitivity, and the increase in capacitance (e.g., due to reduced number of gaps 303") results in reduced sensitivity. Therefore, sensitivity and capacitance can advantageously be balanced as desired via the use of such gaps 303", 307" to divide the electrodes 302", 305".

With reference to FIG. 7, each of the portions 305A"-305F" of the center electrode 305" is connected in series with one of the portions 302A"-302F" of the circumferential electrode 302" via a connection via 304". The microphone 300C can have one or more bond pads 316" connected to the circumferential electrode 302" and center electrode 305". Each of the center electrode portions 305A"-305F" defines a capacitor with a corresponding portion underneath it of the middle electrode layer 314", and each of the outer circumferential electrode portions 302A"-302F" defines a capacitor with a corresponding portion underneath it of the middle electrode layer 314", where the center electrode portions 305A"-305F" have a different polarity than the corresponding portions below it from the middle electrode layer 314", the electric field extends vertically (between the electrode layers 314", 315") and vertical capacitance exists therebetween. With respect to FIGS. 7-8, the electrical signal travels vertically between the top electrode 315" and middle electrode 314".

The center electrode 305" can be spaced from the circumferential electrode 302" so that the center electrode 305" is substantially centered relative to the circumferential electrode 302" (e.g., both electrodes 302", 305" have the same central axis), with at least a portion of the diaphragm 319" extending between the circumferential electrode 302" and the center electrode 305". As shown in FIGS. 7-8, the diaphragm 319" can extend beneath the circumferential electrode 302" and beneath the center electrode 305". A through hole 317" can be formed (e.g., etched) in the diaphragm 319" (e.g., in the piezoelectric film layer 309" and elastic layer 312" that define the diaphragm 319") at a location between the circumferential electrode 302" and the center electrode 305". The through hole 317" can extend from a top surface of the diaphragm 319" to a bottom surface of the diaphragm 319" to thereby extend completely through the diaphragm 319". The microphone 300C can have an opening 320" in the substrate 301" that is located underneath the diaphragm 319", which allows the diaphragm 319" to move (e.g., deflect).

With continued reference to FIG. 7, the electrodes 302", 305" are advantageously located (e.g., electrode 302" along the periphery and electrode 305" at the center of the diaphragm structure 319") where the highest stress, therefore highest output voltage or electrical energy via piezoelectric effect, is induced by sound pressure exerted on the diaphragm 319" (e.g., via air pressure delivered through the opening 320" toward the diaphragm 319"). As discussed further below, the single piezoelectric film layer 309" can be advantageously be substantially stress free, such as with approximately zero (e.g., zero) residual stress. Additionally, the microphone 300C advantageously has a larger relative capacitance (e.g., with respect to microphones 300A, 300B). However, the microphone 300C can have output voltage that is smaller because of the increased number of layers in the microphone structure.

The through holes 317, 317', 317" in the diaphragms 319, 319', 319" of the microphones 300A, 300B, 300C can advantageously allow the low frequency roll off of the microphone 300A, 300B, 300C to be defined substantially precisely (e.g., at approximately 85 Hz±15 Hz, such as for cell phone applications). That is, the size of the through hole 317, 317', 317" can advantageously provide the desired value for the low frequency roll off (e.g., there is a correlation between the size of the through hole and the value of the low frequency roll off).

The diaphragm 319, 319', 319" of the microphone 300A, 300B, 300C has a single piezoelectric layer structure that advantageously provides higher sensitivity (about 2-3 dB higher) and better low-frequency roll-off control (−3 dB frequency) than cantilever structures with the same piezoelectric layer. The diaphragm 319, 319', 319" with single piezoelectric layer structure also has lower sensitivity than a multi-layer diaphragm.

FIGS. 9A-9J show cross-sectional views of structures illustrating steps of a method 400 of manufacturing a piezoelectric MEMS microphone. Though FIGS. 9A-9J show the method 400 for manufacturing the microphone 300A, one of skill in the art will recognize that the method 400 can also be used to manufacture the microphone 300B.

Figure 9A:
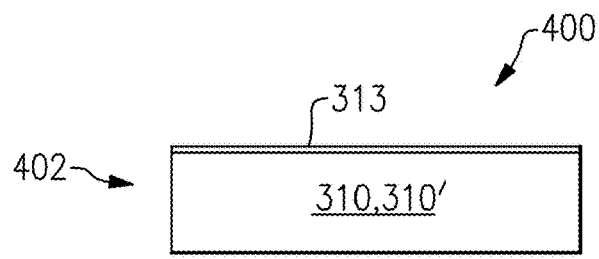
FIG. 9A is a cross-sectional side view of one step in the manufacture of a piezoelectric MEMS microphone.

FIG. 9A shows the step of forming or providing 402 a piezoelectric substrate 310 and an adhesive layer 313, 313' over the piezoelectric substrate 310, 310'. Optionally, the piezoelectric substrate 310, 310' can be made of Lithium Niobate (LiNbO3) or Lithium Tantalate (LiTaO3).

Figure 9B:
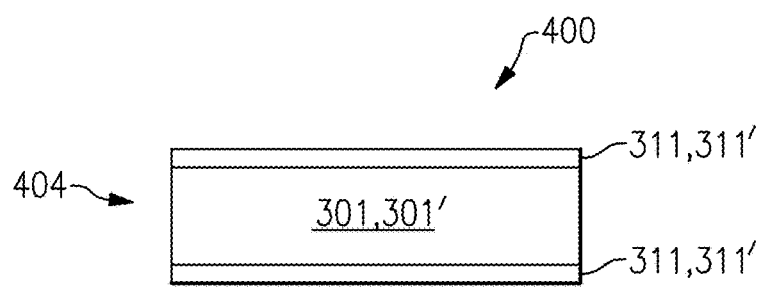
FIG. 9B is a cross-sectional side view of another step in the manufacture of a piezoelectric MEMS microphone.

FIG. 9B shows the step of forming or providing 404 a substrate 301, 301' with an oxidation layer 311, 311' on one or both of a top surface and a bottom surface of the substrate 301, 301'. Optionally, the oxidizing can be performed with a thermal oxidation furnace. In one implementation, the oxidation layer 311, 311' optionally has a thickness of approximately 2-3 µm. The top oxidation layer can provide isolation between the substrate 301, 301' and the piezoelectric substrate 310, 310', as further discussed below. The bottom oxidation layer can be used as a hard mask to define a window for later etching the opening 320, 320' into the microphone 300A, 300B. The substrate 301, 301' can be made of Silicon, and the oxidation layers can be of Silicon dioxide.

Figure 9C:
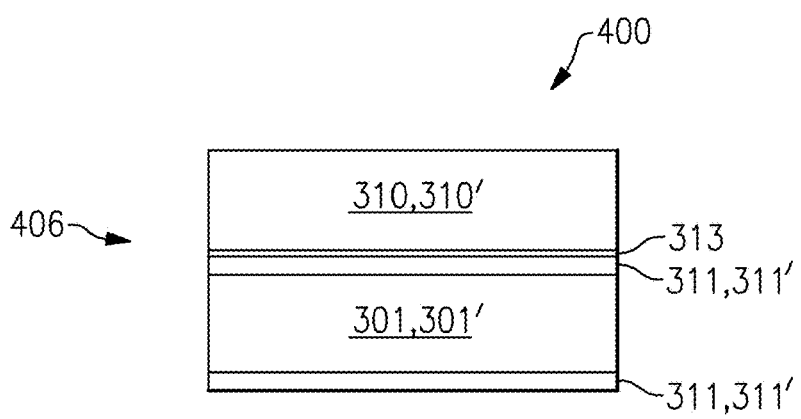
FIG. 9C is a cross-sectional side view of another step in the manufacture of a piezoelectric MEMS microphone.

FIG. 9C shows the step of bonding 406 the substrate 301, 301' to the piezoelectric substrate 310, 310'. The piezoelectric substrate 310, 310' can be flipped or rotated, so the adhesive layer 313 is facing down, and placed on top of the substrate 301, 301' so that the adhesive layer 313 contacts the top oxidation layer 311, 311'.

Figure 9D:
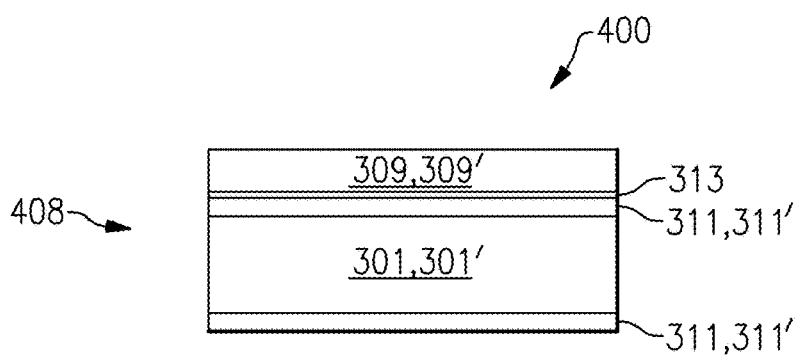
FIG. 9D is a cross-sectional side view of another step in the manufacture of a piezoelectric MEMS microphone.

FIG. 9D shows the step of thinning 408 the piezoelectric substrate 310, 310' to form the piezoelectric film 309, 309' (e.g., to form the single piezoelectric film 309, 309'). In one implementation, the piezoelectric film 309, 309' can have a thickness of approximately 500 nm. Thinning techniques such as an ion slicing process and/or chemical mechanical polishing (CMP) process can optionally be used.

FIG. 9E shows the step of forming or providing 410 the electrode 315, 315' on the piezoelectric film 309, 309' (e.g., depositing and patterning, such as using wet etching, dry etching, etc., the electrode 315, 315' on the piezoelectric film 309, 309'). Optionally, the electrode can be formed or applied 410 using a sputter machine and patterned by dry etching (e.g., using Reactive Ion Etch (RIE) and/or Inductively Coupled Plasma (ICP) etch). In one implementation, the electrode optionally has a thickness of approximately 30 nm.

FIG. 9E also shows the step of forming or providing (e.g., depositing) 412 the passivation layer 318, 318' on top of the electrode 315, 315' and/or the piezoelectric film 309, 309'. Optionally, the passivation layer can be formed or applied 412 using a sputter machine or a Chemical Vapor Deposition (CVD) machine. In one implementation, the passivation layer optionally has a thickness of approximately 50 nm. The passivation layer 318, 318' can serve to protect the top of the microphone 300A, 300B.

FIG. 9F shows the step of forming (e.g., etching) 414 vias in the structure. Optionally, the vias can be etched using an Inductively Coupled Plasma (ICP) etch machine and process. FIG. 9F also shows the step of forming or providing (e.g., patterning) 416 bond pads 316, 316'. Optionally, the one or more bond pads can be formed or applied 416 using a sputter machine, or an E-beam evaporator and lift-off process.

FIG. 9G shows the step of forming (e.g., etching) 418 the through hole 317, 317' in the structure (e.g., through the passivation layer 318, 318', piezoelectric film 309, 309', and top oxidation layer 311, 311').

FIG. 9H shows the step of forming 420 a top protection layer (e.g., a silicon dioxide layer) on top of (e.g., adjacent to, attached to) the passivation layer 318, 318' and the bond pads 316, 316'. Optionally, the top protection layer can be formed or applied 420 using a Plasma Enhanced Chemical Vapor Deposition (PECVD) machine and process. In one implementation, the top protection layer optionally has a thickness of approximately 2 µm.

FIG. 9H also shows the step of forming (e.g., etching) 422 the bottom oxide layer of the substrate 301, 301' to provide a hard mask. Optionally, the patterning and etching 422 of the oxide layer on the bottom of the substrate can be performed using a Reactive Ion Etch (RIE) and/or Inductively Coupled Plasma (ICP) etch machine and process.

FIG. 9I shows the step of forming (e.g., etching) 424 the opening 320, 320' in the substrate 301, 301' underneath the diaphragm 319, 319'. Optionally, the etching 424 of the substrate can be performed using a Deep Reactive Ion Etching (DRIE) machine and process.

FIG. 9J shows the step of removing (e.g., etching) 426 the top protection layer (e.g., oxide layer) from on top of the passivation layer 318, 318' and bond pads 316, 316' and from a bottom of the substrate 301, 301' to provide the finished microphone 300A, 300B. Optionally, the removing (e.g., etching) 426 of the protection layer, oxide layer on the bottom of the substrate and oxide layer under the piezoelectric film can be performed using a Vapor Hydrogen Fluoride (VHF) etch machine and process. The opening 320, 320' allows sound pressure to pass therethrough to exert a force on the diaphragm 319, 319' to deflect the diaphragm 319, 319'.

FIGS. 10A-10J show cross-sectional views of structures illustrating steps of a method 500 of manufacturing a piezoelectric MEMS microphone. In one implementation, the method 500 can be used to manufacture a piezoelectric MEMS microphone similar to the microphone 300C having a circular shape.

Figure 10A:
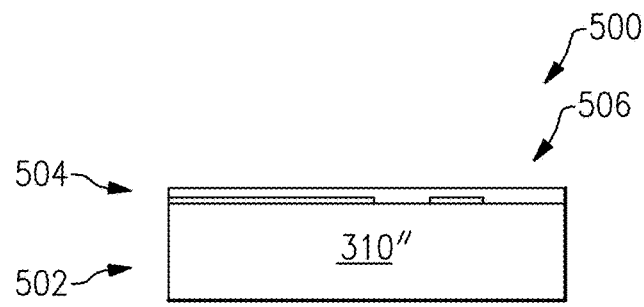
FIG. 10A is a cross-sectional side view of one step in the manufacture of a piezoelectric MEMS microphone.

FIG. 10A shows the step of forming or providing 502 a piezoelectric substrate (e.g., similar to the piezoelectric substrate 310"), forming or providing 504 a first electrode (e.g., similar to the first electrode 314"), such as by depositing the first electrode on top of the piezoelectric substrate, and forming or providing 506 an adhesive layer 313" over the first electrode and/or the piezoelectric substrate. Optionally, the piezoelectric substrate can be made of Lithium Niobate (LiNbO3) or Lithium Tantalate (LiTaO3). Optionally, the first electrode can be formed or applied 504 using a sputter machine and patterned by dry etching (e.g., using Reactive Ion Etch (RIE) and/or Inductively Coupled Plasma (ICP) etch). In one implementation, the first electrode optionally has a thickness of approximately 30 nm.

Figure 10B:
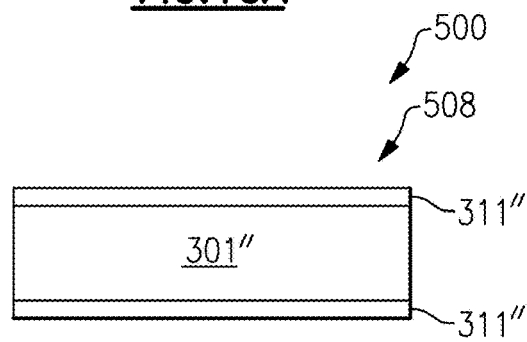
FIG. 10B is a cross-sectional side view of another step in the manufacture of a piezoelectric MEMS microphone.

FIG. 10B shows the step of forming or providing 508 a substrate (e.g., similar to the substrate 301") with an oxidation layer (e.g., similar to the oxidation layer 311") on one or both of a top surface and a bottom surface of the substrate. Optionally, the oxidizing can be performed with a thermal oxidation furnace. In one implementation, the oxidation layer optionally has a thickness of approximately 2-3 µm. The top oxidation layer can provide isolation between the substrate and the piezoelectric substrate, as further discussed below. The bottom oxidation layer can be used as a hard mask to define a window for later etching an opening (e.g., similar to the opening 320") into the piezoelectric MEMS microphone. The substrate can be made of Silicon, and the oxidation layers can be of Silicon dioxide.

Figure 10C:
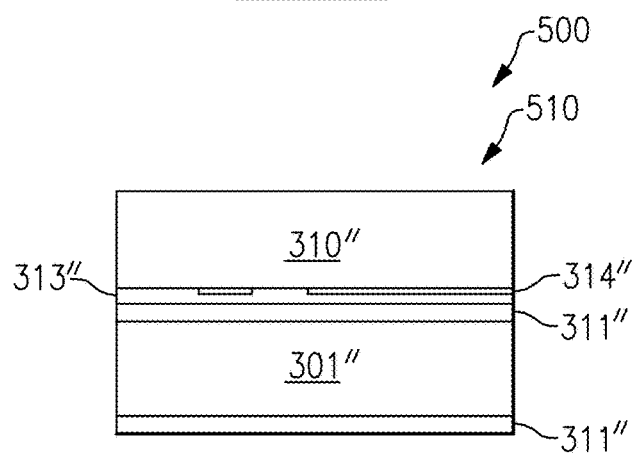
FIG. 10C is a cross-sectional side view of another step in the manufacture of a piezoelectric MEMS microphone.

FIG. 10C shows the step of bonding 510 the substrate to the piezoelectric substrate. The piezoelectric substrate can be flipped or rotated, so the adhesive layer 313" is facing down, and placed on top of the substrate so that the adhesive layer 313" contacts the top oxidation layer.

Figure 10D:
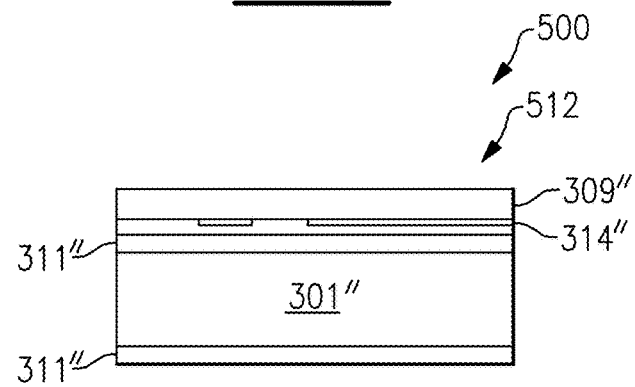
FIG. 10D is a cross-sectional side view of another step in the manufacture of a piezoelectric MEMS microphone.

FIG. 10D shows the step of thinning 512 the piezoelectric substrate to form the piezoelectric film (e.g., similar to the piezoelectric film 309"), for example to form the single piezoelectric film. In one implementation, the piezoelectric film can have a thickness of approximately 500 nm. Thinning techniques such as an ion slicing process and/or chemical mechanical polishing (CMP) process can optionally be used.

FIG. 10E shows the step of forming or providing 514 a second electrode (e.g., similar to the second electrode 315") on the piezoelectric film (e.g., depositing and patterning, such as using wet etching, dry etching, etc., the second electrode on the piezoelectric film). Optionally, the electrode can be formed or applied 514 using a sputter machine and patterned by dry etching (e.g., using Reactive Ion Etch (RIE) and/or Inductively Coupled Plasma (ICP) etch). In one implementation, the electrode optionally has a thickness of approximately 30 nm.

FIG. 10E also shows the step of forming or providing (e.g., depositing) 515 an elastic layer (e.g., similar to the elastic layer 312") on top of the second electrode and/or the piezoelectric film. In one implementation, the elastic layer optionally has a thickness of approximately 500 nm.

FIG. 10F shows the step of forming (e.g., etching) 516 vias in the structure. Optionally, the vias can be etched using an Inductively Coupled Plasma (ICP) etch machine and process. FIG. 10F also shows the step of forming or providing (e.g., patterning) 518 bond pads (e.g., similar to bond pads 316"). Optionally, the one or more bond pads can be formed or applied 518 using a sputter machine, or an E-beam evaporator and lift-off process.

FIG. 10G shows the step of forming (e.g., etching) 520 a through hole (e.g., similar to the through hole 317") in the structure (e.g., through the elastic layer, piezoelectric film, adhesive layer 313", and top oxidation layer).

FIG. 10H shows the step of forming 522 a top protection layer (e.g., a silicon dioxide layer) on top of (e.g., adjacent to, attached to) the elastic layer and the bond pads. Optionally, the top protection layer can be formed or applied 522 using a Plasma Enhanced Chemical Vapor Deposition (PECVD) machine and process. In one implementation, the top protection layer optionally has a thickness of approximately 2 μm.

FIG. 10H also shows the step of forming (e.g., etching) 524 the bottom oxide layer of the substrate to provide a hard mask. Optionally, the patterning and etching 524 of the oxide layer on the bottom of the substrate can be performed using a Reactive Ion Etch (RIE) and/or Inductively Coupled Plasma (ICP) etch machine and process.

FIG. 10I shows the step of forming (e.g., etching) 526 an opening (e.g., similar to the opening 320") in the substrate underneath the diaphragm defined by the piezoelectric film and the elastic layer. Optionally, the etching 526 of the substrate can be performed using a Deep Reactive Ion Etching (DRIE) machine and process.

FIG. 10J shows the step of removing (e.g., etching) 528 the top protection layer (e.g., oxide layer) from on top of the elastic layer and bond pads and from a bottom of the substrate to provide the finished piezoelectric MEMS microphone. Optionally, the removing (e.g., etching) 528 of the protection layer, oxide layer on the bottom of the substrate and oxide layer under the piezoelectric film can be performed using a Vapor Hydrogen Fluoride (VHF) etch machine and process. The opening (e.g., similar to the opening 320") allows sound pressure to pass therethrough to exert a force on the diaphragm to deflect the diaphragm.

FIGS. 11A-11J show cross-sectional views of structures illustrating steps of a method 600 of manufacturing a piezoelectric MEMS microphone. In one implementation, the method 600 can be used to manufacture a piezoelectric MEMS microphone similar to the microphone 300C having a circular shape.

Figure 11A:
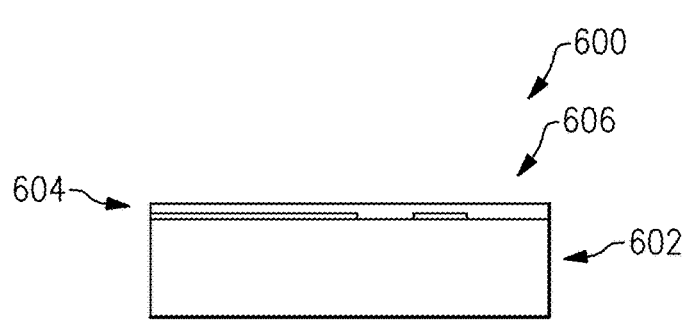
FIG. 11A is a cross-sectional side view of one step in the manufacture of a piezoelectric MEMS microphone.

FIG. 11A shows the step of forming or providing 602 a piezoelectric substrate (e.g., similar to the piezoelectric substrate 310"), forming or providing 604 a first electrode (e.g., similar to the first electrode 314"), such as by depositing the first electrode on top of the piezoelectric substrate, and forming or providing 606 an adhesive layer 313" over the first electrode and/or the piezoelectric substrate. Optionally, the piezoelectric substrate can be made of Lithium Niobate (LiNbO3) or Lithium Tantalate (LiTaO3). Optionally, the first electrode can be formed or applied 604 using a sputter machine and patterned by dry etching (e.g., using Reactive Ion Etch (RIE) and/or Inductively Coupled Plasma (ICP) etch). In one implementation, the first electrode optionally has a thickness of approximately 30 nm.

Figure 11B:
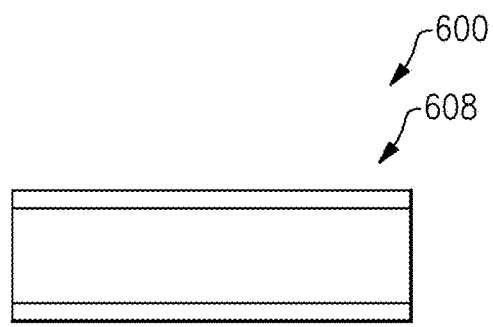
FIG. 11B is a cross-sectional side view of another step in the manufacture of a piezoelectric MEMS microphone.

FIG. 11B shows the step of forming or providing 608 a substrate (e.g., similar to the substrate 301") with an oxidation layer (e.g., similar to the oxidation layer 311") on one or both of a top surface and a bottom surface of the substrate. Optionally, the oxidizing can be performed with a thermal oxidation furnace. In one implementation, the oxidation layer optionally has a thickness of approximately 2-3 μm. The top oxidation layer can provide isolation between the substrate and the piezoelectric substrate, as further discussed below. The bottom oxidation layer can be used as a hard mask to define a window for later etching an opening (e.g., similar to the opening 320") into the piezoelectric MEMS microphone. The substrate can be made of Silicon, and the oxidation layers can be of Silicon dioxide.

Figure 11C:
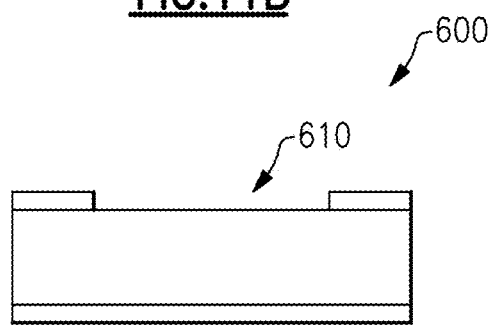
FIG. 11C is a cross-sectional side view of another step in the manufacture of a piezoelectric MEMS microphone.

FIG. 11C shows the step of forming (e.g., etching) 610 the top oxide layer of the substrate to provide a hard mask. Optionally, the patterning and etching 524 of the oxide layer on the top of the substrate can be performed using a Reactive Ion Etch (RIE) and/or Inductively Coupled Plasma (ICP) etch machine and process.

Figure 11D:
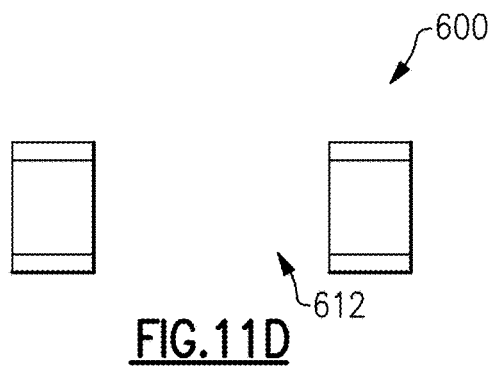
FIG. 11D is a cross-sectional side view of another step in the manufacture of a piezoelectric MEMS microphone.

FIG. 11D shows the step of forming (e.g., etching) 612 an opening (e.g., similar to the opening 320") in the substrate and oxidation layers to define spaced apart substrate portions. Optionally, the etching 612 of the substrate can be performed using a Deep Reactive Ion Etching (DRIE) machine and process.

Figure 11E:
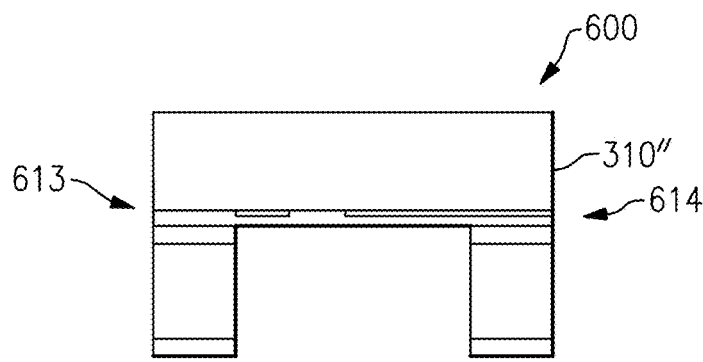
FIG. 11E is a cross-sectional side view of another step in the manufacture of a piezoelectric MEMS microphone.

FIG. 11E shows the step of bonding 614 the substrate portions to the piezoelectric substrate. The piezoelectric substrate can be flipped or rotated, so the adhesive layer 313" is facing down, and placed on top of the substrate portions so that the adhesive layer 313" contacts the top oxidation layer of the substrate portions.

Figure 11F:
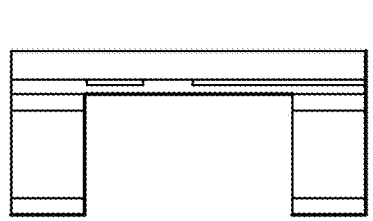
FIG. 11F is a cross-sectional side view of another step in the manufacture of a piezoelectric MEMS microphone.

FIG. 11F shows the step of thinning 616 the piezoelectric substrate to form the piezoelectric film (e.g., similar to the piezoelectric film 309"), for example to form the single piezoelectric film. In one implementation, the piezoelectric film can have a thickness of approximately 500 nm. Thinning techniques such as an ion slicing process and/or chemical mechanical polishing (CMP) process can optionally be used.

Figure 11I:
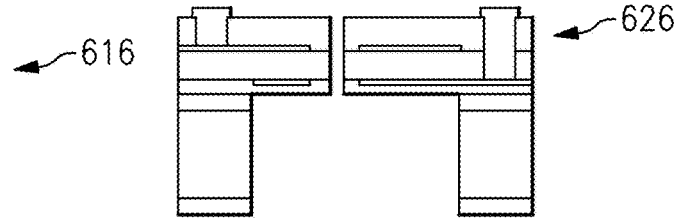
FIG. 11I is a cross-sectional side view of another step in the manufacture of a piezoelectric MEMS microphone.
Figure 11G:
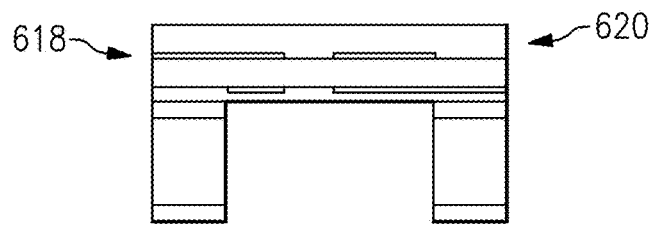
FIG. 11G is a cross-sectional side view of another step in the manufacture of a piezoelectric MEMS microphone.

FIG. 11G shows the step of forming or providing 618 a second electrode (e.g., similar to the second electrode 315") on the piezoelectric film (e.g., depositing and patterning, such as using wet etching, dry etching, etc., the second electrode on the piezoelectric film). Optionally, the electrode can be formed or applied 618 using a sputter machine and patterned by dry etching (e.g., using Reactive Ion Etch (RIE) and/or Inductively Coupled Plasma (ICP) etch). In one implementation, the electrode optionally has a thickness of approximately 30 nm.

FIG. 11G also shows the step of forming or providing (e.g., depositing) 620 an elastic layer (e.g., similar to the elastic layer 312") on top of the second electrode and/or the piezoelectric film. In one implementation, the elastic layer optionally has a thickness of approximately 500 nm.

Figure 11H:
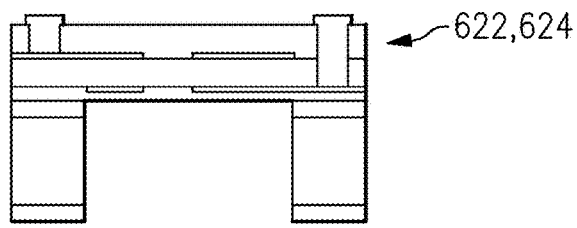
FIG. 11H is a cross-sectional side view of another step in the manufacture of a piezoelectric MEMS microphone.

FIG. 11H shows the step of forming (e.g., etching) 622 vias in the structure. Optionally, the vias can be etched using an Inductively Coupled Plasma (ICP) etch machine and process.

FIG. 11H also shows the step of forming or providing (e.g., patterning) 624 bond pads (e.g., similar to bond pads 316"). Optionally, the one or more bond pads can be formed or applied 518 using a sputter machine, or an E-beam evaporator and lift-off process.

FIG. 11I shows the step of forming (e.g., etching) 626 a through hole (e.g., similar to the through hole 317") in the structure (e.g., through the elastic layer, piezoelectric film, adhesive layer 313", and top oxidation layer).

In use, the microphone structure 300A, 300B, 300C is mounted on a printed circuit board (PCB) so that the opening 320, 320', 320" is disposed over or otherwise generally aligned with an opening in the PCB through which sound pressure enters into the opening 320, 320', 320" to deflect the diaphragm 319, 319', 319" as discussed above. Advantageously, the piezoelectric substrate 310, 310', 310" has substantially zero residual stress (e.g., has zero residual stress), so that the piezoelectric film 309, 309', 309" formed by thinning the piezoelectric substrate or wafer 310', 310', 310" likewise has substantially zero (e.g., zero) residual stress.

While certain embodiments of the inventions have been described, these embodiments have been presented by way of example only, and are not intended to limit the scope of the disclosure. Indeed, the novel methods and systems described herein may be embodied in a variety of other forms. Furthermore, various omissions, substitutions and changes in the systems and methods described herein may be made without departing from the spirit of the disclosure. The accompanying claims and their equivalents are intended to cover such forms or modifications as would fall within the scope and spirit of the disclosure. Accordingly, the scope of the present inventions is defined only by reference to the appended claims.

Features, materials, characteristics, or groups described in conjunction with a particular aspect, embodiment, or example are to be understood to be applicable to any other aspect, embodiment or example described in this section or elsewhere in this specification unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The protection is not restricted to the details of any foregoing embodiments. The protection extends to any novel one, or any novel combination, of the features disclosed in this specification (including any accompanying claims, abstract and drawings), or to any novel one, or any novel combination, of the steps of any method or process so disclosed.

Furthermore, certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a claimed combination can, in some cases, be excised from the combination, and the combination may be claimed as a subcombination or variation of a subcombination.

Moreover, while operations may be depicted in the drawings or described in the specification in a particular order, such operations need not be performed in the particular order shown or in sequential order, or that all operations be performed, to achieve desirable results. Other operations that are not depicted or described can be incorporated in the example methods and processes. For example, one or more additional operations can be performed before, after, simultaneously, or between any of the described operations. Further, the operations may be rearranged or reordered in other implementations. Those skilled in the art will appreciate that in some embodiments, the actual steps taken in the processes illustrated and/or disclosed may differ from those shown in the figures. Depending on the embodiment, certain of the steps described above may be removed, others may be added. Furthermore, the features and attributes of the specific embodiments disclosed above may be combined in different ways to form additional embodiments, all of which fall within the scope of the present disclosure. Also, the separation of various system components in the implementations described above should not be understood as requiring such separation in all implementations, and it should be understood that the described components and systems can generally be integrated together in a single product or packaged into multiple products.

For purposes of this disclosure, certain aspects, advantages, and novel features are described herein. Not necessarily all such advantages may be achieved in accordance with any particular embodiment. Thus, for example, those skilled in the art will recognize that the disclosure may be embodied or carried out in a manner that achieves one advantage or a group of advantages as taught herein without necessarily achieving other advantages as may be taught or suggested herein.

Conditional language, such as "can," "could," "might," or "may," unless specifically stated otherwise, or otherwise understood within the context as used, is generally intended to convey that certain embodiments include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

Conjunctive language such as the phrase "at least one of X, Y, and Z," unless specifically stated otherwise, is otherwise understood with the context as used in general to convey that an item, term, etc. may be either X, Y, or Z. Thus, such conjunctive language is not generally intended to imply that certain embodiments require the presence of at least one of X, at least one of Y, and at least one of Z.

Language of degree used herein, such as the terms "approximately," "about," "generally," and "substantially" as used herein represent a value, amount, or characteristic close to the stated value, amount, or characteristic that still performs a desired function or achieves a desired result. For example, the terms "approximately", "about", "generally," and "substantially" may refer to an amount that is within less than 10% of, within less than 5% of, within less than 1% of, within less than 0.1% of, and within less than 0.01% of the stated amount. As another example, in certain embodiments, the terms "generally parallel" and "substantially parallel" refer to a value, amount, or characteristic that departs from exactly parallel by less than or equal to 15 degrees, 10 degrees, 5 degrees, 3 degrees, 1 degree, or 0.1 degree.

The scope of the present disclosure is not intended to be limited by the specific disclosures of preferred embodiments in this section or elsewhere in this specification, and may be defined by claims as presented in this section or elsewhere in this specification or as presented in the future. The language of the claims is to be interpreted broadly based on the language employed in the claims and not limited to the examples described in the present specification or during the prosecution of the application, which examples are to be construed as non-exclusive.

Of course, the foregoing description is that of certain features, aspects and advantages of the present invention, to which various changes and modifications can be made without departing from the spirit and scope of the present invention. Moreover, the shielded inductor need not feature all of the objects, advantages, features and aspects discussed above. Thus, for example, those of skill in the art will recognize that the invention can be embodied or carried out in a manner that achieves or optimizes one advantage or a group of advantages as taught herein without necessarily achieving other objects or advantages as may be taught or suggested herein. In addition, while a number of variations of the invention have been shown and described in detail, other modifications and methods of use, which are within the scope of this invention, will be readily apparent to those of skill in the art based upon this disclosure. It is contemplated that various combinations or subcombinations of these specific features and aspects of embodiments may be made and still fall within the scope of the invention. Accordingly, it should be understood that various features and aspects of the disclosed embodiments can be combined with or substituted for one another in order to form varying modes of the discussed shielded inductor.

What is claimed is:

1. A piezoelectric microelectromechanical systems microphone, comprising:
   a substrate defining an opening between a bottom end of the substrate and a top end of the substrate;
   a single piezoelectric film layer formed by thinning a piezoelectric wafer disposed over the top end of the substrate and defining a diaphragm structure, the single piezoelectric film layer having substantially zero residual stress; and
   an electrode disposed over the diaphragm structure, wherein the diaphragm structure is configured to deflect when subjected to sound pressure via the opening in the substrate.

2. The microphone of claim 1 wherein the electrode disposed over the diaphragm structure includes a circumferential electrode disposed over a circumference of the diaphragm structure and a center electrode disposed generally over a center of the diaphragm structure, at least a portion of the center electrode spaced apart from the circumferential electrode.

3. The microphone of claim 2 wherein the circumferential electrode is divided into two or more circumferential electrode portions by one or more gaps therebetween and the center electrode is divided into two or more center electrode portions by one or more gaps therebetween to provide a microphone with a desired sensitivity and capacitance.

4. The microphone of claim 1 wherein the electrode disposed over the diaphragm structure include a peripheral electrode having side electrode portions disposed adjacent side edges of the diaphragm structure, the side electrode portions spaced apart from each other, and a center electrode disposed generally over a center of the diaphragm structure, at least a portion of the center electrode spaced apart from the peripheral electrode.

5. The microphone of claim 1 further comprising a through hole in the diaphragm structure that extends from a top surface of the diaphragm structure to a bottom surface of the diaphragm structure, the through hole configured to define a low frequency roll off for the microphone.

6. The microphone of claim 1 further comprising a second electrode interposed between the substrate and a bottom surface of the piezoelectric film layer.

7. The microphone of claim 6 further comprising an elastic layer disposed at least partially adjacent an upper surface or a bottom surface of the piezoelectric film layer, one of the electrode and the second electrode being interposed between at least a portion of the elastic layer and at least a portion of the piezoelectric film layer.

8. A radiofrequency module, comprising:
   a printed circuit board including a substrate layer;
   one or more piezoelectric microelectromechanical systems microphones mounted on the printed circuit board, each microphone including: a substrate defining an opening between a bottom end of the substrate and a top end of the substrate, a single piezoelectric film layer disposed over the top end of the substrate and defining a diaphragm structure, the single piezoelectric film layer having substantially zero residual stress, and an electrode disposed over the diaphragm structure, the diaphragm structure configured to deflect when subjected to sound pressure via the opening in the substrate.

9. The radiofrequency module of claim 8 wherein the electrode disposed over the diaphragm structure includes a circumferential electrode disposed over a circumference of the diaphragm structure and a center electrode disposed generally over a center of the diaphragm structure, at least a portion of the center electrode spaced apart from the circumferential electrode.

10. The radiofrequency module of claim 9 wherein the circumferential electrode is divided into two or more circumferential electrode portions by one or more gaps therebetween and the center electrode is divided into two or more center electrode portions by one or more gaps therebetween to provide a microphone with a desired sensitivity and capacitance.

11. The radiofrequency module of claim 8 wherein the electrode disposed over the diaphragm structure include a peripheral electrode having side electrode portions disposed adjacent side edges of the diaphragm structure, the side electrode portions spaced apart from each other, and a center electrode disposed generally over a center of the diaphragm structure, at least a portion of the center electrode spaced apart from the peripheral electrode.

12. The radiofrequency module of claim 8 further comprising a through hole in the diaphragm structure that extends from a top surface of the diaphragm structure to a bottom surface of the diaphragm structure, the through hole configured to define a low frequency roll off for the microphone.

13. The radiofrequency module of claim 8 further comprising a second electrode interposed between the substrate and a bottom surface of the piezoelectric film layer.

14. The radiofrequency module of claim 13 further comprising an elastic layer disposed at least partially adjacent an upper surface or a bottom surface of the piezoelectric film layer, one of the electrode and second electrode being interposed between at least a portion of the elastic layer and at least a portion of the piezoelectric film layer.

15. A wireless mobile device comprising:
one or more antennas;
a front end system that communicates with the one or more antennas; and
one or more piezoelectric microelectromechanical systems microphones mounted on a substrate layer, each microphone including: a substrate defining an opening between a bottom end of the substrate and a top end of the substrate, a single piezoelectric film layer disposed over the top end of the substrate and defining a diaphragm structure, the single piezoelectric film layer having substantially zero residual stress, and an electrode disposed over the diaphragm structure, the diaphragm structure configured to deflect when subjected to sound pressure via the opening in the substrate.

16. The wireless mobile device of claim 15 wherein the electrode disposed over the diaphragm structure includes a circumferential electrode disposed over a circumference of the diaphragm structure and a center electrode disposed generally over a center of the diaphragm structure, at least a portion of the center electrode spaced apart from the circumferential electrode.

17. The wireless mobile device of claim 16 wherein the circumferential electrode is divided into two or more circumferential electrode portions by one or more gaps therebetween and the center electrode is divided into two or more center electrode portions by one or more gaps therebetween to provide a microphone with a desired sensitivity and capacitance.

18. The wireless mobile device of claim 15 wherein the electrode disposed over the diaphragm structure include a peripheral electrode having side electrode portions disposed adjacent side edges of the diaphragm structure, the side electrode portions spaced apart from each other, and a center electrode disposed generally over a center of the diaphragm structure, at least a portion of the center electrode spaced apart from the peripheral electrode.

19. The wireless mobile device of claim 15 further comprising a through hole in the diaphragm structure that extends from a top surface of the diaphragm structure to a bottom surface of the diaphragm structure, the through hole configured to define a low frequency roll off for the microphone.

20. The wireless mobile device of claim 15 further comprising a second electrode interposed between the substrate and a bottom surface of the piezoelectric film layer.

21. The wireless mobile device of claim 20 further comprising an elastic layer disposed at least partially adjacent an upper surface or a bottom surface of the piezoelectric film layer, one of the electrode and second electrode being interposed between at least a portion of the elastic layer and at least a portion of the piezoelectric film layer.

* * * * *